(12) United States Patent
Matsuba et al.

(10) Patent No.: US 7,081,214 B2
(45) Date of Patent: Jul. 25, 2006

(54) ELECTROCONDUCTIVE METAL PASTE AND METHOD FOR PRODUCTION THEREOF

(75) Inventors: Yorishige Matsuba, Ibaraki (JP); Yoshihisa Misawa, Ibaraki (JP); Hideyuki Goto, Ibaraki (JP); Masayuki Ueda, Ibaraki (JP); Katsuhisa Oosako, Ibaraki (JP); Masaaki Oda, Chiba (JP); Norimichi Saito, Chiba (JP); Toshihiro Suzuki, Chiba (JP); Noriyuki Abe, Chiba (JP)

(73) Assignees: Harima Chemicals, Inc., Hyogo (JP); ULVAC, Inc., Kanagawa (JP)

( * ) Notice: Subject to any disclaimer, the term of this patent is extended or adjusted under 35 U.S.C. 154(b) by 253 days.

(21) Appl. No.: 10/415,004

(22) PCT Filed: Sep. 26, 2001

(86) PCT No.: PCT/JP01/08340

§ 371 (c)(1),
(2), (4) Date: Apr. 21, 2003

(87) PCT Pub. No.: WO02/35554

PCT Pub. Date: May 2, 2002

(65) Prior Publication Data

US 2004/0004209 A1    Jan. 8, 2004

(30) Foreign Application Priority Data

Oct. 25, 2000  (JP) .............................. 2000-325414
Aug. 3, 2001  (JP) .............................. 2001-236650

(51) Int. Cl.
*C09D 5/24* (2006.01)
*C22C 9/00* (2006.01)
*H01B 1/22* (2006.01)
*H05K 1/09* (2006.01)
*B05D 7/00* (2006.01)

(52) U.S. Cl. ...................... 252/512; 252/500; 252/503; 252/511; 252/519.3; 427/212; 427/216; 427/220; 428/357

(58) Field of Classification Search ................ 252/500, 252/503, 511, 519.3, 512, 518.1; 427/212, 427/220, 213, 216; 264/7; 977/DIG. 1; 428/357
See application file for complete search history.

(56) References Cited

U.S. PATENT DOCUMENTS

| 4,410,457 A | * | 10/1983 | Fujimura et al. | ............ 252/508 |
| 4,789,411 A | * | 12/1988 | Eguchi et al. | ................ 148/24 |
| 5,204,025 A | * | 4/1993 | Yamada et al. | ............. 252/500 |
| 5,922,403 A | * | 7/1999 | Tecle | ........................... 427/212 |
| 5,977,490 A | * | 11/1999 | Kawakita et al. | ........... 174/265 |

FOREIGN PATENT DOCUMENTS

| JP | 3-3421 | | 2/1991 |
| JP | 04-146976 | * | 5/1992 |
| JP | 06-136299 | * | 5/1994 |
| JP | 10-312712 | * | 11/1998 |
| JP | 11-319538 | | 11/1999 |

* cited by examiner

Primary Examiner—Mark Kopec
Assistant Examiner—Kallambella Vijayakumar
(74) Attorney, Agent, or Firm—Knobbe Martens Olson & Bear, LLP

(57) ABSTRACT

This invention provides a low-temperature sintering conductive paste for high density circuit printing which can form a fine circuit having good adhesive force, a smooth surface and low resistance when applied on a substrate and then baked; the conductive paste of the invention uses, as conductive media, in combination with metal fillers having an average particle diameter of 0.5 to 20 μm, ultrafine metal particles having an average particle diameter of not larger than 100 nm, which are set in the state that the surfaces thereof are coated with one compound or more having a group comprising a nitrogen, oxygen, or sulfur atom and capable of coordinate-bonding by a lone pair existing in the atom, as a group capable of coordinate-bonding to a metal element contained in the ultrafine metal particles, and are dispersed uniformly in a resin composition comprising a heat curable resin component, an organic acid anhydride or a derivative thereof or an organic acid, and one or more organic solvent; and thereby it enables low-temperature sintering of the ultrafine metal particles during a heat treatment at a low temperature.

21 Claims, No Drawings

ELECTROCONDUCTIVE METAL PASTE AND METHOD FOR PRODUCTION THEREOF

This application is the U.S. National Phase under 35 U.S.C. §371 of International Application PCT/JP01/08340, filed Sep. 26, 2001, which claims priority to Japanese Patent Application No. 2000-325414, filed Oct. 25, 2000. and No. 2001-236650, filed Aug. 3, 2001. The International Application was not published under PCT Article 21(2) in English.

TECHNICAL FIELD

The present invention relates to a conductive metal paste and a process for production thereof. More specifically, it relates to a conductive metal paste which is utilized in formation of fine circuits with a low impedance which is adapted for high-density digital wiring in rigid and flexible printed boards, IC chips, glass boards, ceramic boards and the like as well as formation of an interlayer interconnection by means of such as screen printing or dispensing printing method; and to a process for production of the conductive metal paste.

BACKGROUND ART

As one of the processes for production of ultrafine metal particles having very small particle diameters, or ultrafine metal particles having an average particle diameter of 100 nm or smaller, Japanese Patent Application Laid-Open No. 34211/1991 discloses ultrafine metal particles with particle diameters of not larger than 10 nm which are prepared by using a gas evaporation method and dispersed in a colloidal state, and a process for production thereof. Further, Japanese Patent Application Laid-Open No. 319538/1999 for example, discloses ultrafine metal particles with an average particle diameter of about several nanometers to several tens of nanometers which are dispersed in a colloidal state by using a reduction precipitation method with an amine compound for reduction, and a process for production thereof.

The ultrafine metal particles with an average particle diameter of about several nanometers to several tens of nanometers disclosed in Japanese Patent Application Laid-Open No. 319538/1999, for example, such that their surface are coated with a polymer resin, for example, so as to maintain the colloidal state.

In general, the ultrafine metal particles with an average particle diameter of about several nanometers to several tens of nanometers are known to be easily sintered at a temperature which is much lower than their melting point (for example, at a temperature of 200° C. or lower in the case of ultrafine silver particles having clean surfaces). The reason is as follows. That is, as the particle diameters of the ultrafine metal particles are reduced to a sufficient extent, a proportion of atoms in a state of high energy becomes large with respect to total of the atoms present on the surfaces of the particles and the surface diffusion of the metal atoms becomes considerably high, with the result that interfaces between the particles are expanded due to the surface diffusion and thus the particles are sintered.

To attain such an extensive sinter as to achieve a desired performance in conductivity, the polymer resin coating the surfaces needs to be thermally decomposed or evaporated, and the temperature for the treatment must be set higher than at least 300° C., even when silver which has a low melting point is used as the conductive material.

The above surface diffusion itself in the ultrafine particles occurs even at temperatures lower than 300° C. Thus, when the contained ultrafine particles together form compact sintered random chains and thereby form a network as a whole in order to eventually attain desired electric conductivity, the polymer resin present on the surfaces of the particles for retaining the colloidal state interferes with the formation of the random chains. Therefore, when drying and curing are carried out at a temperature lower than 300° C., an excessively stabilized colloidal state of the ultrafine metal particles in a paste causes an adverse effect, whereby the particles cannot form the random chains required for conductivity. As a result, resistance becomes too higher for practical use.

However, when it is necessary that sintering be conducted at a temperature higher than at least 300° C., it is needless to say that a substrate on which such a conductive metal paste is printed must be one having a sufficient heat-resistance at a sintering temperature exceeding 300° C. That is, a range of materials usable as a material of the substrate is limited accordingly. In addition, when sintering needs to be conducted at such a temperature, there is no effective organic binder with excellent heat resistance available for the conductive metal paste, and therefore, there remain problems in mechanical strength, i.e., its sinter shows low strength of adhesion to the substrates, and it comes off or is flawed.

Further, once the sintering of ultrafine particles having an average particle diameter of not larger than 10 nm is initiated, following the surface diffusion therein progressing fast, mutual coalescence of ultrafine particles in contact with one another occurs, and also mutual fusion thereof eventually occurs, causing a phenomenon referred to as "particle growth". The particle growth means a phenomenon that a plurality of fine particles in contact with one another fuse interfaces thereof and integrate one another so as to grow into one big granule. In that case, a reduction in the total surface areas of a plurality of the fine particles as a whole occurs, and gap spaces present between the fine particles included within an envelope of a composite formed by a plurality of the fine particles are eliminated, so that it results in "volume shrinkage" which is a reduction in the apparent volume of the composite. In general, in a conductive metal paste using superfine particles of conventional composition, as an average particle diameter thereof is decreased in size, a ratio of change in a reduction in surface areas and "volume shrinkage" are increased, and cracks may be caused to occur on the surface of a cured product or breakage of a tight-connecting interface between the sinter and the substrate may occur. Due to such reasons, in the conductive metal paste using superfine particles of conventional composition, difficulty of uniform film formation increases along with an increase in film thickness. For example, in formation of a film having a thickness of at least several microns, particularly a thickness exceeding 10 microns, difficulty in controlling its conductivity within a desired range is further increased.

Meanwhile, a commonly used conductive paste for general-purpose uses metal powders with an average particle diameter of 0.5 to 20 μm which are prepared by a grinding method, an electrolysis method, a reduction method or the like, and since the metal powders are physically contacted with one another through curing and shrinkage of a binder resin so as to attain electric conductivity, resistance in each metal particle is sufficiently small, a contact area thereof is also relatively large, and conductivity is also good. On account of these advantages, in a variety of fields where a thickness and line width to be formed is not extremely small, a conventional paste using metal powders having an average particle diameter of 0.5 μm or larger is widely used. However, it is the current situation that as the thickness and line width of a film to be formed decrease along with a decreased wiring pitch in printed wiring and an increased fineness of a circuit in a semiconductor device owing to down-sizing of an information terminal in recent years, the conventional paste cannot conform to such needs since the particle diameters of the metal powders are too large. To state more specifically, for example, when assuming a film having a thickness of about several microns, only two or three metal particles exist in the thickness direction thereof, and in such condition, the intrinsic non-uniformity in contact between particles brings about relatively large deviation in conductivity and consequently, stability in its continuity becomes unsatisfactory. Further, as it composes the decreased number of particles, it shows roughness on the surface reflecting the shapes of the metal particles, thereby impairing the smoothness of the surface.

DISCLOSURE OF THE INVENTION

Along with a market demand for higher density wiring, a conductive metal paste for use in circuit drawing is required to exhibit excellent performance for narrower line width and lower resistance and further for low-temperature curability. From this viewpoint, when conductive metal pastes using a variety of fine powders of metal, which have been previously proposed, are studied, it is the current situation that among the conductive metal pastes using conventional fine powders of metal, there exists no conductive metal paste for high density circuit printing that not only achieves desired conductivity but also greatly satisfies both requirements for conductivity and mechanical strength, which pastes use a binder resin which can be cured at low temperatures.

In addition, it is the current situation that there exists no conductive metal paste for super high density or superfine circuit printing that is available for superfine circuit printing where an allowable range of deviation for a minimum line width in printed circuits may be rendered small as compared with a particle diameter of a conventionally used metal filler.

The present invention has been conceived to solve the above problems. An object of the present invention is to provide a low-temperature sintering conductive metal paste for high-density circuit printing and a process for production thereof, which uses, as conductive media constituting the conductive metal paste, ultrafine metal particles and also metal fillers having larger particle diameters, shows good adhesive force when applied on a substrate and then sintered, exhibits a smooth surface even when applied to a relatively large thickness, and thereby can form a fine circuit having a low resistance. In addition, another object of the present invention is to provide a low-temperature sintering conductive metal paste for high-density circuit printing and a process for production thereof, which uses, as an essential conductive medium constituting the conductive metal paste, ultrafine metal particles in stead of metal fillers having large particle diameters, shows good adhesive force and a very smooth surface when applied on a substrate and then sintered, and thereby can form a superfine circuit having and low resistance.

The present inventors have made intensive studies so as to solve the aforementioned problems and found the following. When ultrafine metal particles are used as a conductive medium constituting a conductive metal paste, a stabilized colloidal state can desirably be used in preparing the conductive metal paste itself from the viewpoint of improvement on agglomeration resistance. However, if a molecular layer which covers the surfaces of the ultrafine metal particles and contributes to retention of said colloidal state remains as it is while heating and curing a thermosetting resin used as an organic binder, for example, fusion at their contact interfaces by low temperature sintering which is essential to attaining excellent conductivity is inhibited. As a result of further researches and studies based on the finding, they have also found that if the constitutions are selected in which the molecular layer covering the surfaces of ultrafine metal particles are formed to contribute to retention of a stabilized colloidal state while a conductive metal paste is stored around room temperature after its preparation, and on the other hand the molecular layer covering the surface can be effectively removed at the time of curing a low-temperature curable organic binder by heating, a thin film wiring pattern can have sufficient adhesive force to a substrate due to the organic binder heat-treated, for example, cured by heating, at a proper temperature when the paste is applied to the pattern, and sufficiently high conductivity can be imparted to the thin film wiring pattern to be formed and high reproducibility thereof can also be maintained while advantages such as the smoothness of the surface and high-density circuit drawability that are ascribable to use of the ultrafine particles being in the uniformly dispersed colloidal state are retained.

More specifically, for the purpose that the ultrafine metal particles constituting the conductive metal paste remain in the state of being coated with one compound or more which has a group containing a nitrogen, oxygen or sulfur atom and capable of coordinate-bonding by lone pairs existing in these atoms as a group capable of coordinate-bonding to a metal element contained in the ultrafine metal particle, e.g., one amine compound or more having at one or more terminal amino groups, until heat treatment (such as curing by heating), the one or more compounds having the group containing the nitrogen, oxygen or sulfur atom are contained in a given amount based on the weight of the ultrafine metal particles.

In addition, the present inventors have found that when a composition is chosen where added is an organic acid anhydride or a derivative thereof or an organic acid which can react with said compound which has the group containing the nitrogen, oxygen or sulfur atom, e.g., the terminal amino group of the amine compound at the time of heating so as to remove said compound which has the group containing the nitrogen, oxygen or sulfur atom from the surfaces of the ultrafine metal particles, to a varnish-like resin composition in which the colloidal ultrafine metal particles are dispersed, a conductive metal paste in which the ultrafine metal particles are dispersed in a stable colloidal state is obtained, and while it maintains high printability of excellent fine lines and high agglomeration resistance during storage, it can provide a conductive metal paste cured product having desired conductivity even if the organic binder is heat-treated, e.g., cured by heating, at a relatively low temperature. In addition to the finding, the present inventors have also found that when metal fillers having much larger particle diameters than the ultrafine metal particles are used in combination with the ultrafine metal particles so as to alleviate the influence of "volume shrinkage" associated with sintering of the ultrafine metal particles even when the thickness of the wiring pattern to be formed is increased, its total thickness is maintained by the metal fillers, gaps among the fillers are filled with a sintered structure of the ultrafine metal particles, and thereby its surface can be smoothed and extremely good conductivity can be achieved by the metal fillers with the sintered structure of the ultrafine metal particles. The present invention has been completed based on these findings.

That is, a first aspect in the present invention is a low-temperature sintering conductive metal paste for high density circuit printing: The low-temperature sintering conductive metal paste for high density circuit printing according to the present invention is a conductive metal paste wherein:

the conductive metal paste comprises a varnish-like resin composition, metal fillers and ultrafine metal particles having a very small average particle diameter, that are both dispersed uniformly in the composition, an average particle diameter for said metal fillers is selected from a range of 0.5 to 20 μm, an average particle diameter for said ultrafine metal particles with a very small average particle diameter is chosen from a range of 1 to 100 nm, the surfaces of the ultrafine metal particles are coated with one compound or more which has a group containing a nitrogen, oxygen or sulfur atom and capable of coordinate-bonding by lone pairs existing in these atoms as a group capable of coordinate-bonding to a metal element contained in the ultrafine metal particle, said one or more compounds having the group containing the nitrogen, oxygen or sulfur atom are contained in a total amount of 0.1 to 60 parts by weight based on 100 parts by weight of said ultrafine metal particles, said varnish-like resin composition comprises a resin component acting as an organic binder, a compound component having reactivity with the group containing a nitrogen, oxygen or sulfur atom as for the compound which has the group containing the nitrogen, oxygen or sulfur atom when heated, and at least one or more organic solvents, and said varnish-like resin composition is contained in an amount of 5 to 100 parts by weight based on 100 parts by weight of a total of the metal fillers and the ultrafine metal particles having a very small average particle diameter. An example of the conductive metal paste is a conductive metal paste containing an organic acid anhydride or a derivative thereof or an organic acid as the compound component having reactivity with the group containing the nitrogen, oxygen or sulfur atom in the compound having the group when heated. Further, the conductive metal paste may be a conductive metal paste wherein the ultrafine metal particles having a very small average particle diameter are ultrafine metal particles composed of at least one or more metals out of silver, gold, copper, platinum, palladium, rhodium, ruthenium, iridium, osmium, tungsten, nickel, tantalum, bismuth, lead, indium, tin, zinc and titanium. In addition, it is more preferable that as to the ultrafine metal particles have a very small average particle diameter, their average particle diameter is selected from a range of 2 to 10 nm.

In the conductive metal paste of the present invention, the resin component acting as an organic binder in the varnish-like resin composition is preferably selected from thermosetting resins.

Meanwhile, as for the compound having a group containing a nitrogen, oxygen or sulfur atom that is used for coating the surface of the ultrafine metal particle, one or more of amine compounds having one or more terminal amino groups may be selected. In that case, for example, the one amine compound or more having one or more terminal amino groups is more preferably an alkylamine.

In the conductive metal paste of the present invention, particularly, the ratio between the contents of said metal fillers and the ultrafine metal particles having a very small average particle diameter is preferably such that the content of the metal fillers is selected from a range of 0.1 to 1,000 parts by weight per 10 parts by weight of the ultrafine metal particles having a very small average particle diameter.

In addition, the present invention also provides a process for producing efficiently the conductive metal paste mentioned above with high reproducibility. That is, the process for production of a conductive metal paste of the present invention may be a process for producing a conductive metal paste comprising the step of preparing a conductive metal paste in which metal fillers and ultrafine metal particles with a very small average particle diameter are dispersed uniformly in a varnish-like resin composition, wherein:

an average particle diameter for said ultrafine metal particles with a very small average particle diameter is selected from a range of 1 to 100 nm, a dispersion obtained by dispersing the ultrafine metal particles in one or more organic solvents is used, where the surfaces of the ultrafine metal particles are in the state of being coated with one compound or more which has a group containing a nitrogen, oxygen or sulfur atom and capable of coordinate-bonding by lone pairs existing in these atoms as a group capable of coordinate-bonding to a metal element contained in the ultrafine metal particle, wherein said dispersion of the ultrafine metal particles is prepared into a composition wherein said one compound or more having the group containing the nitrogen, oxygen or sulfur atom are contained in a total amount of 0.1 to 60 parts by weight, at need, based on 100 parts by weight of the ultrafine metal particles, with said dispersion of the ultrafine metal particles, a resin component acting as an organic binder, a compound component having reactivity with the group containing the nitrogen, oxygen or sulfur atom when heated with the compound having the group containing the nitrogen, oxygen or sulfur atom, and an organic solvent as required, which are comprised in said composition, are mixed and stirred so as to prepare the varnish-like resin composition, and thereby a paste mixture comprising said ultrafine metal particles being uniformly dispersed therein are obtained, the metal fillers of which an average particle diameter is selected from a range of 0.5 to 20 μm are further added to said paste mixture, which is then uniformly mixed into a paste, and the paste is formulated such that content ratio of said varnish-like resin composition therein is set in an amount of 5 to 100 parts by weight based on 100 parts by weight of a total of the metal fillers and the ultrafine metal particles having a very small average particle diameter. For example, the process of the present invention may be a process for producing a conductive metal paste wherein the compound component having reactivity with the group containing the nitrogen, oxygen or sulfur atom, when heated with said compound which has the group containing the nitrogen, oxygen or sulfur atom, is an organic acid anhydride or a derivative thereof or an organic acid.

Based on the findings described above, the present inventors have also completed another invention of a conductive metal paste for superfine circuit printing. That is, in the case where metal fillers having relatively large particle diameters are not used and only ultrafine metal particles are used as a conductive medium constituting a conductive metal paste, if its construction is chosen such that a molecular layer covering the surface of each ultrafine metal particle are formed to contribute to retention of its stabilized colloidal state while the conductive metal paste is stored around room temperature after its preparation and on the other hand, the molecular layer covering the surface can be removed effectively at the time of, for example, heating and curing a low-temperature curable organic binder, a thin film wiring pattern to be formed has sufficient adhesive force to a substrate due to the organic binder heat-treated, for example, cured by heating at a proper temperature, and sufficiently high conductivity can be imparted to the thin film wiring pattern to be formed and high reproducibility thereof can also be maintained while advantages such as the smoothness of the surface and high-density circuit drawability that are ascribable to use of the ultrafine particles being in the uniformly dispersed colloidal state are retained.

More specifically, the present inventors have found that since the paste is composed such that on purpose that the ultrafine metal particles constituting the conductive metal paste are in the state of being coated with one amine compound or more which has one or more terminal amino groups being capable of coordinate-bonding to a metal element contained in the ultrafine metal particle until the heat treatment, said one or more amine compounds are contained in a given content based on the ultrafine metal particles; and to a varnish-like resin composition in which the colloidal ultrafine metal particles are dispersed, further added are an organic acid anhydride or a derivative thereof or an organic acid which can react with the terminal amino group of the amine compound at the time of heating so as to remove said amine compounds from the surfaces of the ultrafine metal particles, a conductive metal paste in which the ultrafine metal particles are dispersed in a stable colloidal state is obtained, and it remains high printability of excellent superfine lines and high agglomeration resistance during storage, and also a conductive metal paste cured product having desired conductivity can be obtained thereby even if the organic binder therein is cured by heating at a relatively low temperature.

That is, a second aspect in the present invention is a low-temperature sintering conductive metal paste for superfine circuit printing. The low-temperature sintering conductive metal paste for superfine circuit printing according to the present invention is a conductive metal paste wherein:

the conductive metal paste comprises a varnish-like resin composition and ultrafine metal particles having a very small average particle diameter, that are dispersed uniformly in the composition, the average particle diameter for said ultrafine metal particles with a very small average particle diameter is selected from a range of 1 to 100 nm, the surfaces of the ultrafine metal particles are coated with one compound or more which has a group containing a nitrogen, oxygen or sulfur atom and capable of coordinate-bonding by lone pairs existing in these atoms as a group capable of coordinate-bonding to a metal element contained in the ultrafine metal particle, said varnish-like resin composition comprises a resin component acting as an organic binder, a compound component having reactivity with the group containing a nitrogen, oxygen or sulfur atom as for the compound which has the group containing the nitrogen, oxygen or sulfur atom when heated, and at least one or more organic solvents, and said one or more compounds having the group containing the nitrogen, oxygen or sulfur atom are contained in a total amount of 0.1 to 60 parts by weight based on 100 parts by weight of the ultrafine metal particles. An example of the conductive metal paste is a paste containing an organic acid anhydride or a derivative thereof or an organic acid as the compound component having reactivity with the group containing the nitrogen, oxygen or sulfur atom when heated with the compound having the group containing the nitrogen, oxygen or sulfur atom. Further, the conductive metal paste may be a conductive metal paste wherein the ultrafine metal particles having a very small average particle diameter are ultrafine metal particles composed of at least one or more metals out of silver, gold, copper, platinum, palladium, tungsten, nickel, tantalum, bismuth, lead, indium, tin, zinc and titanium. Further, it is preferable that the average particle diameter for the ultrafine metal particles is selected from a range of 2 to 10 nm.

In the conductive metal paste of the present invention, it is preferred that the resin component acting as an organic binder contained in the varnish-like resin composition is selected from thermosetting resins, thermoplastic resins or thermally decomposable resins.

Meanwhile, as the compound having the group containing the nitrogen, oxygen or sulfur atom which is used for coating the surface of the ultrafine metal particle, one amine compound or more having one or more terminal amino groups may be selected. In that case, for example, one or more of the amine compounds having one or more terminal amino groups is more preferably an alkylamine.

In addition, the present invention also provides a process for producing efficiently the conductive metal paste described above with high reproducibility. That is, the process for production of a conductive metal paste of the present invention is a process for producing a conductive metal paste comprising the step of preparing a conductive metal paste in which ultrafine metal particles with a very small average particle diameter are dispersed uniformly in a varnish-like resin composition, wherein:

an average particle diameter for said ultrafine metal particles with a very small average particle diameter is selected from a range of 1 to 100 nm, a dispersion obtained by dispersing the ultrafine metal particles in one or more organic solvents is used, where the surfaces of the ultrafine metal particles are in the state of being coated with one compound or more which has a group containing a nitrogen, oxygen or sulfur atom and capable of coordinate-bonding by lone pairs existing in these atoms as a group capable of coordinate-bonding to a metal element contained in the ultrafine metal particle, wherein said dispersion of the ultrafine metal particles is prepared into a composition wherein said one compound or more having the group containing the nitrogen, oxygen or sulfur atom are contained in a total amount of 0.1 to 60 parts by weight, at need, based on 100 parts by weight of the ultrafine metal particles, and with said dispersion of the ultrafine metal particles, a resin component acting as an organic binder, a compound component having reactivity with the group containing the nitrogen, oxygen or sulfur atom when heated with the compound having the group containing the nitrogen, oxygen or sulfur atom, and an organic solvent as required, which are comprised in said composition, are mixed and stirred so as to prepare the varnish-like resin composition, and thereby a paste mixture comprising said ultrafine metal particles being uniformly dispersed therein are obtained. For example, the process of the present invention may be a process for producing a conductive metal paste wherein the compound component having reactivity with the group containing the nitrogen, oxygen or sulfur atom, when heated with said compound which has the group containing the nitrogen, oxygen or sulfur atom, is an organic acid anhydride or a derivative thereof or an organic acid.

Further, as the amine compound used in the present invention, a polyoxyalkyleneamine can also be used in place of alkylamine. The polyoxyalkyleneamine refers to a compound which has a polyether skeleton comprising a plurality of oxyalkylene units and one or more amino groups at terminals thereof.

BEST MODE FOR CARRYING OUT THE INVENTION

Hereinafter, a conductive metal paste of the present invention and a production process thereof will be further described.

The conductive metal paste of the present invention is one with a primarily use for high-density printing, which is applicable in formation of a fine circuit with a low impedance which is adapted for digital high-density wiring and formation of interlayer bonding by means of such screen printing or dispense printing. In addition, by use of its fine printing capability, it may also be used in formation of a conductive film penetrating through a fine hole and an embedded layer. Furthermore, a thermoset film to be formed therewith exhibits an excellent uniformity in its film thickness, and by use of the advantage; for instance, it may be applicable in formation of a thin conductive film constituting various sensors.

To adapt for the aforementioned uses, the low-temperature sintering conductive metal paste for high-density circuit printing of the present invention uses metal fillers and ultrafine metal particles in combination as conductive media. With respect to the metal fillers and ultrafine metal particles contained in the conductive metal paste, the average particle diameter for the metal fillers is selected from a range of 0.5 to 20 μm according to the target line width of a printed circuit pattern and the film thickness of the paste after heat-cured, and then the average particle diameter of the ultrafine metal particles which is set to densely fill gaps among the metal fillers is selected from a range of 1 to 100 nm. The average particle diameter of the ultrafine metal particles is preferably selected from a range of 2 to 10 nm.

Further, since the low-temperature sintering conductive metal paste for superfine circuit printing of the present invention is one for superfine printing that is applicable in formation of a superfine circuit with a low impedance which is adapted to digital high-density wiring and formation of interlayer bonding, as for the ultrafine metal particles contained as an essential conductive medium, its average particle diameter is selected from a range of 1 to 100 nm according to the target line width of superfine printing and the film thickness of the paste after a heat treatment (such as heat-curing). It is preferably selected from a range of 2 to 10 nm. As the average particle diameter for the ultrafine metal particles contained therein is selected from said range, the paste can be applied to a pattern with a superfine line width by screen printing, dispensing printing or dot printing. Further, for dot printing, a known method such as a so-called ink jet printing method can also be used.

As mentioned above, if the ultrafine metal particles are used in dry form, the particles stick to each another once they contact with one other, which results in agglomeration thereof. Such agglomerates are not suitable for high-density printing aimed in the present invention. To prevent the agglomeration of the particles, used are ultrafine metal particles that have a coating layer with small molecules formed on their surfaces and thereby are in the state of being dispersed in a liquid.

In addition, in the conductive metal paste of the present invention, ultrafine metal particles on which no oxide film is substantially present are used so as to cause fusion to occur at interfaces between contacted ultrafine metal particles contained as a conductive medium when the resin component contained is heat-treated, e.g., heat-cured. More specifically, the ultrafine metal particles used as a raw material are coated with one compound or more having a group containing a nitrogen, oxygen or sulfur atom as a group capable of coordinate-bonding to a metal element contained in the ultrafine metal particle. That is, a dispersion obtained by dispersing ultrafine metal particles in one or more organic solvents is used, wherein the ultrafine metal particles are in the state of being densely coated with at one compound or more having a group containing a nitrogen, oxygen or sulfur atom as a group capable of coordinate-bonding to a metal element contained in the ultrafine metal particle, for example, coated with one amine compound or more having one or more terminal amino groups. Due to the effect of the coating layer, the ultrafine metal particles retains in the state where the metal surfaces thereof do not make direct contact with one another until a heat treatment is carried out, which suppresses agglomeration of the ultrafine metal particles contained in the conductive paste, and whereby agglomeration resistance during storage can be maintained at a high level. Further, even if the ultrafine metal particles make contact with moisture or oxygen molecules in the air at the time of applying, formation of a natural oxide film on the surfaces of the ultrafine metal particles by the moisture or oxygen molecules in the air is suppressed because the surfaces of the ultrafine metal particles are already covered with the coating layer and therefore do not come into direct contact with the water molecules or oxygen molecules.

The compound used for densely coating the surfaces of the ultrafine metal particles is a compound which uses a group having a lone pair on a nitrogen, oxygen or sulfur atom when forming a coordinate bond to a metal element. For example, an amino group is included in groups containing a nitrogen atom. Alternatively, a group containing a sulfur atom may include a sulfanyl group (—SH) or a sulfide-type sulfandiyl group (—S—); and a group containing an oxygen atom may include a hydroxy group or an ether-type oxy group (—O—).

One typical example of a usable compound having an amino group is an alkylamine. Among the alkylamine, suitable is one that does not come off in a normal storage environment, more specifically, at a temperature lower than 40° C., once it comes into the state of forming a coordinate bond to a metal element, and thus an alkylamine having a boiling point of not lower than 60° C., preferably not lower than 100° C. is preferred. However, since the alkylamine must come off from the surfaces of the ultrafine metal particles quickly when the heat treatment (such as heat-curing) of the conductive metal paste is carried out, it is preferred that a boiling point of the alkylamine is selected at least from a range not higher than 300° C., generally not higher than 250° C. For example, as to the alkylamine above-mentioned, an $C_4$ to $C_{20}$ alkyl group is usable, more preferably selected from a range of $C_8$ to $C_{18}$, and those having an amino group at terminals of their alkyl chain are usable. For example, since said alkylamine selected from a range of $C_8$ to $C_{18}$ has thermal stability and its vapor pressure is not so high, it is also easy to keep and control its content within a desired range during storage at room temperature or the like, and therefore such an alkylamine is suitably used due to its ease of handling. In general, a primary amine type compound is preferred in forming the coordinate bond since it exhibits a higher bonding capability, while compounds of secondary and tertiary amine type may also be used. Further, compounds having two or more adjacent amino groups that are involved in their bonding, such as 1,2- and 1,3-diamine type compounds, may also be used. A polyoxyalkyleneamine may also be used. Furthermore, in addition to the terminal amino group, a compound further having a hydrophilic terminal group, for example a hydroxylamine having a hydroxyl group such as ethanolamine, can also be used.

On the other hand, a typical example of a usable compound having a sulfanyl group (—SH) is an alkanethiol. Among the alkanethiols, suitable is one that does not come off in a normal storage environment, more specifically, at a temperature lower than 40° C., once it comes into the state of forming a coordinate bond to a metal element, and thus an alkanethiol having a boiling point of not lower than 60° C., preferably not lower than 100° C. is preferred. However, since the alkanethiol must come off from the surfaces of the ultrafine metal particles quickly when the heat treatment (such as heat-curing) of the conductive metal paste is carried out, it is preferred that a boiling point of the alkanethiol is selected at least from a range not higher than 300° C., generally not higher than 250° C. For example, as to the alkanethiol above-mentioned, a $C_4$ to $C_{20}$ alkyl group is usable, more preferably selected from a range of $C_8$ to $C_{18}$, and those having a sulfanyl group (—SH) at terminals of their alkyl chain are usable. For example, since said alkanethiol selected from a range of $C_8$ to $C_{18}$ has thermal stability and its vapor pressure is not so high, it is also easy to keep and control its content within a desired range during storage at room temperature or the like, and therefore such an alkanethiol is suitably used due to its ease of handling. In general, a primary thiol type compound is preferred in forming the coordinate bond since it exhibits a higher bonding capability, while compounds of secondary and tertiary thiol type may also be used. Further, compounds having two or more sulfanyl groups (—SH) that are involved in their bonding, such as 1,2-dithiol type compounds, may also be used.

Further, a typical example of a usable compound having a hydroxyl group is an alkanediol. Examples of the alkanediol include glycols such as ethylene glycol, diethylene glycol and a polyethylene glycol. Among the alkanediols, suitable is one that does not come off in a normal storage environment, more specifically, at a temperature lower than 40° C., once it comes into the state of forming a coordinate bond to a metal element, and thus an alkanediol having a boiling point of not lower than 60° C., preferably not lower than 100° C. is preferred. However, since the alkanediol must come off from the surfaces of the ultrafine metal particles quickly when the heat treatment (such as heat-curing) of the conductive metal paste is carried out, it is preferred that a boiling point of the alkanediol is selected at least from a range not higher than 300° C., generally not higher than 250° C. Further, compounds having two or more hydroxy groups that are involved in their bonding, such as 1,2-diol type compounds, may also be used.

Additionally, in the varnish-like resin composition, there is contained a compound component which has reactivity with a group containing a nitrogen, oxygen or sulfur atom when heated with the aforementioned compound having the group containing the nitrogen, oxygen or sulfur atom as a group capable of coordinate-bonding to a metal element, which is coating the surfaces of the ultrafine metal particles, and such as an organic acid anhydride or a derivative thereof or an organic acid. The compound having reactivity with the group containing the nitrogen, oxygen or sulfur atom is used to remove, when heated, said coating layer covering the surfaces of the ultrafine metal particles which are formed of the compound having the group containing the nitrogen, oxygen or sulfur atom as a group capable of coordinate-bonding to a metal element. That is, when heated, it reacts with the group containing the nitrogen, oxygen or sulfur atom in the coating compound which forms the coating layer around room temperature, and as a result of the reaction, it becomes difficult for the reacted group containing the nitrogen, oxygen or sulfur atom to form a coordinate bond to a metal atom on the surface of the ultrafine metal particle, so that the coating layer is eventually removed. This removing capability is not exhibited around room temperature where the conductive paste is prepared and stored but is to be exhibited for the first time during the heat treatment of the conductive paste subsequent to its application. More specifically, an added acid anhydride or acid anhydride derivative is used to form an amide, thioester or ester by reacting with the compound having the group containing the nitrogen, oxygen or sulfur atom such as an amine compound, thiol compound or diol compound under heating. Once such an amine compound, thiol compound or diol compound coating the surfaces of the ultrafine metal particles forms the amide, thioester or ester respectively, it becomes difficult for them to form the coordinate bond to the metal atom, so that the coating layer on the surface of the ultrafine metal particle is removed as result.

Due to this effect, at first, the ultrafine metal particles are dispersed uniformly in the conductive paste and can take a closely packing state so as to fill, for example, slight roughness of the surface of a substrate to be coated or gaps between the metal fillers used in combination therewith when the paste is coated. Before the heat treatment, direct contact between the metal surfaces of the ultrafine metal particles is avoided since the surfaces of the ultrafine metal particles taking the closely packing state is covered with the coating layer formed of the compound having the group containing the nitrogen, oxygen or sulfur atom. However, as the heat treatment proceeds in that state and the coating layer is thereby removed, the metal surfaces make direct contact with each other, and thus the ultrafine metal particles undergo sintering even at a relatively low temperature. Eventually, the ultrafine metal particles in the coating film are converted into dense sintered bodies while keeping the closely packing state so as to fill the slight roughness of the surface of a substrate coated thereby and the gaps between the metal fillers used in combination therewith, and good electro-conductivity is achieved in the whole heat-cured conductive paste through the dense sintered bodies.

Accordingly, the acid anhydride or acid anhydride derivative used for the reaction with the compound having the group containing the nitrogen, oxygen or sulfur atom at the step of removing the above coating layer is preferably added at least in an amount larger than the equivalent, on basis of the total amount of terminal amino groups, sulfanyl groups (—SH) or hydroxyl groups contained in such a compound as amine compound, thiol compound or diol compound mentioned above. In some cases, the acid anhydride or acid anhydride derivative may also react with a basic metal oxide film present on the surface of the metal filler when heated and have a function of producing a metal salt of a carboxylic acid thereof. Thus, in consideration of the reactivity, a slightly excessive amount is selected as appropriate.

As long as the reactivity explained above is exhibited, an organic acid anhydride or derivative thereof or organic acid to be used is not particularly limited. For instance, examples of usable organic acids may include $C_1$ to $C_{10}$ linear saturated carboxylic acids such as formic acid, acetic acid, propionic acid, butanoic acid, hexanoic acid and octyl acid, $C_1$ to $C_{18}$ linear or branched saturated carboxylic acids or unsaturated carboxylic acids such as stearic acid, isostearic acid, oleic acid, linoleic acid, acrylic acid, methacrylic acid, crotonic acid, cinnamic acid, benzoic acid and sorbic acid, and dimer and trimer acids which are polymers of oleic acid, linoleic acid and the like, and also dibasic acids such as oxalic acid, malonic acid, sebacic acid, maleic acid, fumaric acid, itaconic acid, alkylsuccinic acid and alkenylsuccinic acid, and in addition to variety of carbonic acids, other organic acids having a phosphoric group (—O—P(O)(OH)$_2$) or sulfonic group (—SO$_3$H) in place of a carboxy group such as a phosphoric ester and a sulfonic acid.

Further, examples of organic acid anhydrides and organic acid anhydride derivatives which can be suitably used include aromatic acid anhydrides such as phthalic anhydride, trimellitic anhydride, pyromellitic anhydride, benzophenone tetracarboxylic anhydride, ethylene glycol bis(anhydrotrimellitate) and glycerol tris(anhydrotrimellitate), alicyclic acid anhydrides such as maleic anhydride, succinic anhydride, tetrahydrophthalic anhydride, methyltetrahydrophthalic anhydride, methylnadic anhydride, alkylsuccinic anhydride, alkenylsuccinic anhydride, hexahydrophthalic anhydride, methylhexahydrophthalic anhydride and methylcyclohexenetetracarboxylic anhydride, and aliphatic acid anhydrides such as polyadipic anhydride, polyazelaic anhydride and polysebacic anhydride. Among these, methyltetrahydrophthalic anhydride, methylhexahydrophthalic anhydride, alkenyl-succinic anhydride, and their derivatives are suitably used because they have moderate reactivity with, for example, terminal amino groups of an amine compound even at a relatively low temperature for heat treatment (sintering) which is a target of the present invention.

The organic acid anhydride or organic acid anhydride derivative is used to react with a compound used as a layer to coat the metal surfaces of ultrafine metal particles, for example, an amine compound having terminal amino groups such as an alkylamine or polyoxyalkyleneamine so as to form an amide thereof at the time of heat-curing. Therefore, the content of the acid anhydride or acid anhydride derivative is selected as appropriate according to the type and content of contained compound which has a group containing a nitrogen, oxygen or sulfur atom, for example, alkylamine or polyoxyalkyleneamine used as an amine compound having terminal amino groups. More specifically, for example, when an acid anhydride or acid anhydride derivative derived from a dibasic acid such as methyltetrahydrophthalic anhydride, methylhexahydrophthalic anhydride, alkenylsuccinic anhydride and derivatives thereof is used, its content (in moles) is desirably larger than ½ of a total (moles) of amine groups derived from the above amine compound having terminal amino groups such as an alkylamine or polyoxyalkyleneamine. However, the content of the acid anhydride or acid anhydride derivative derived from a dibasic acid is preferably kept equal to or smaller than the total (moles) of the amine groups derived from the above amine compound having terminal amino groups such as an alkylamine or a polyoxyalkyleneamine. Further, when an organic acid is used in place of the organic acid anhydride or derivative thereof, its amount is selected from the range described above on the premise that each mole of carboxy groups, phosphoric groups (—O—P(O)(OH)$_2$) or sulfonic groups (—SO$_3$H) correspond to one molecule of the acid anhydride derived from the dibasic acid.

In the low-temperature sintering conductive metal paste for high-density circuit printing according to the first aspect of the present invention, metal fillers and ultrafine metal particles having an average particle diameter of 1 to 100 nm chosen from variety of ultrafine metal particles are used as conductive media. That is, while the metal filler having a larger average particle diameter are stacked up so as to primarily define the thickness of a whole film, the ultrafine metal particles densely fill gaps between the metal fillers stacked, thereby acting as a good conductive medium as a whole. For common use of a conductive metal paste, the average particle diameter of the ultrafine metal particles is not required to be very small and is desirably selected from a range of 2 to 10 nm.

In a cured product by heat-treating (heat-cured product) formed by use of the low-temperature sintering conductive metal paste for high-density circuit printing of the present invention, dominant factor governing the conductivity (resistance) of the whole cured product is resistance at a contact surface between the ultrafine metal particles which fill the gaps between the metal fillers so as to achieve good electric contact therebetween, and the conductivity of each ultrafine metal particle itself is a secondary factor. Hence, although a metal constituting each ultrafine metal particle itself is not particularly limited, it is preferred for attaining said suitable average particle diameter of 10 nm or smaller that it be one metal or more selected from noble metals, copper, tungsten, nickel, tantalum, bismuth, lead, indium, tin, zinc, and titanium, typically one metal selected from silver, gold, copper, platinum, palladium, rhodium, osmium, ruthenium, iridium, tungsten, nickel, tantalum, bismuth, lead, indium, tin, zinc, and titanium. Since high conductivity is required for forming such a circuit pattern, ultrafine metal particles comprising a noble metal (i.e., silver, gold, platinum, palladium, rhodium, osmium, ruthenium or iridium) or copper are more preferably used. Of these, silver, gold and copper are more suitably used due to good conductivity. In addition, silver, gold and copper are also more suitable in the following respect as well. That is, when volume shrinkage of the thermosetting resin caused by its curing is used as means for bringing the ultrafine metal particles into contact with each other at the time of sintering and heat-curing the paste, the contact areas of the ultrafine metal particles can be easily expanded because silver, gold and copper have high expansibility. The conductive metal paste of the present invention preferably uses ultrafine metal particles having an average particle diameter of not larger than 10 nm so as to fill the gaps between the metal fillers having large particle diameters. However, even if ultrafine metal particles having an average particle diameter of about 100 nm are used, a state in which the ultrafine metal particles are present uniformly in the gaps between the metal fillers can be attained, and a fine circuit having good adhesive force, a smooth surface and low resistance can be formed when the conductive metal paste is applied on a substrate and sintered. Thus, even when a film thickness is rendered relatively large with respect to a line width, a low-temperature sintering conductive metal paste for high-density circuit printing which can achieve a uniform film thickness and is free from roughness on the surface can be obtained.

On the other hand, as for the metal fillers, metal particles with an average particle diameter selected from a range of 0.5 to 20 μm, which have also been used as a conductive medium in a conventional conductive metal paste, can be used. For instance, examples of suitable materials of the metal fillers include gold, silver, palladium, copper, nickel, tin and lead, and also bismuth, indium and aluminum. That is, metal particles comprising silver, gold, copper or the like are preferably used since each of the metal particles has excellent conductivity and high expansibility. In that case, for the metal fillers and the ultrafine metal particles, the same material can be selected. For the metal fillers used in admixture with the ultrafine metal particles, it is preferred that the amount of the metal fillers is selected at least from a range of 0.1 to 1,000 parts by weight, preferably of 10 to 1,000 parts by weight, more preferably of 20 to 500 parts by weight, based on 10 parts by weight of the ultrafine metal particles. Further, it is more desirable that the average particle diameter of the metal fillers is chosen at least from a range of 10 times or more, preferably more than 50 times as large as the average particle diameter of the ultrafine metal particles.

Further, in the conductive metal paste of the present invention, the surfaces of the ultrafine metal particles contained therein are set in state of being coated with at least one compound or more which has a group containing a nitrogen, oxygen or sulfur atom and capable of coordinate-bonding by lone pairs existing in these atoms as a group capable of coordinate-bonding to a metal element contained in the ultrafine metal particle; for example, it are preferably set in the state of being coated with one amine compounds or more having one or more terminal amino groups. For example, when preparing the conductive metal paste, it is set to comprise said one or more amine compounds in a total amount of 0.1 to 60 parts by weight based on 100 parts by weight of said ultrafine metal particles. It is set to comprise said one or more amine compounds preferably in a total amount of 0.5 to 30 parts by weight, more preferably of 1 to 10 parts by weight, based on 100 parts by weight of said ultrafine metal particles.

A first effect of said amine compound contained in the conductive metal paste of the present invention is to form a coating layer on the surfaces of the ultrafine metal particles so as to prevent the ultrafine metal particles from directly contacting their clean surfaces with one other, sticking to one another and then forming agglomerations, at the step of kneading the varnish-like resin composition by stirring and mixing in the process of preparing the paste. Hence, although the compound used is not limited to a particular type as long as it can form the coating layer on the surface of the ultrafine metal particle, such a compound that is not liable to evaporate at room temperature is desirable. Therefore, as described above, an amine compound having terminal amino groups such as an alkylamine is preferably used. More specifically, as for the alkylamine, an $C_4$ to $C_{20}$ alkyl group is usable, more preferably selected from a range of $C_8$ to $C_{18}$, and those having an amino group at terminals of their alkyl chain are usable. For example, since said alkylamine selected from a range of $C_8$ to $C_{18}$ has thermal stability and its vapor pressure is not so high, it is also easy to keep and control its content within a desired range during storage at room temperature or the like, and therefore such an alkylamine is suitably used due to its ease of handling. To achieve the first effect of forming the coating layer on the surface of the ultrafine metal particle, the content of the compound having an amino group at terminals such as an alkylamine should be selected as appropriate in consideration of the total surface area of the ultrafine metal particles, the type of the metal, and the type of the amine compound such as an alkylamine. In general, in a case where the $C_8$ to $C_{18}$ alkylamine is used, the specific gravity of the metal itself is comparable to that of silver, gold or copper, and the average particle diameter of the ultrafine metal particles is not extremely smaller than 10 nm, it is preferred that the content of the alkylamine in a dispersion comprising the colloid thereof, though varying depending on the type of the metal and the particle diameter, is selected from a range of 0.1 to 60 parts by weight, preferably of 0.5 to 30 parts by weight, more preferably of 1 to 10 parts by weight, based on 100 parts by weight of the ultrafine metal particles. When an amine compound other than the alkylamine is used together therewith, it is also preferred that the total content of the amine compounds is selected from a range of 0.1 to 60 parts by weight, preferably of 0.5 to 30 parts by weight, more preferably of 1 to 10 parts by weight, based on 100 parts by weight of the ultrafine metal particles.

An organic solvent contained in the conductive metal paste of the present invention has a function of a solvent in preparing the varnish-like resin composition by kneading. Further, as explained below, when the ultrafine metal particle used therein is preformed in the form of that attached with the coating layer composed of amine compounds such as alkylamines on its surface and another amine compounds are further added to the amine compounds such as alkylamines forming themselves into the coating layer so as to apply the other amine compound to the coating layer on the surface of the ultrafine metal particle, the organic solvent is also used as a solvent for carrying out the treatment. Thus, as for the organic solvent used for these two purposes, the same organic solvent can be used, or different organic solvents may be also used. The organic solvent is not limited to a particular type as long as it is applicable for said two types of uses. It is preferable to select a nonpolar solvent or low polar solvent, rather than a high polar solvent in which the compound forming the coating layer on the surfaces of the ultrafine metal particles, for example, an amine compound such as an alkylamine, or another amine compound to be applied later is so highly soluble that the coating layer on the surfaces of the ultrafine metal particles may vanish away. In addition, it is preferred that the organic solvent has thermal stability to such an extent that does not undergo thermal decomposition even at a temperature where a heat treatment such as heat-curing of the conductive metal paste of the present invention is carried out in its application to actual use. Further, at the step of applying the conductive metal paste to form fine lines, the viscosity of the conductive metal paste must be kept within a desired liquid viscosity, and in consideration of its ease of handling at such a step, a nonpolar solvent or low polar solvent with a relatively high boiling point which hardly evaporates around room temperature, for example, such as terpineol, a mineral spirit, xylene, toluene, tetradecane or dodecane, is suitably used.

For example, a dispersion in which ultrafine metal particles attached with alkylamines as a coating layer on surfaces thereof are dispersed in a nonpolar solvent or low polar solvent having a relatively high boiling point is very stable and shows good workability when handled, but it is low in polarity as a whole. Hence, when the dispersion is mixed with the thermosetting resin component and the organic acid anhydride derivative thereof or organic acid so as to disperse the ultrafine metal particles in the varnish-like resin composition, if the resin component itself has a poor affinity for the alkylamine present as the coating layer on the surfaces of the ultrafine metal particles, the ultrafine metal particles coated with the alkylamine tend to gradually precipitate down and agglomerate when left to stand. Further, when the mixture comprising the ultrafine metal particles that have precipitated down and agglomerated is print-coated and heat-cured, the surface obtained thereby cannot be smooth always, which is not suitable for high-density printing.

In the conductive metal paste of the present invention, for example, when the affinity of the resin component itself for the alkylamine present as the coating layer on the surfaces of the ultrafine metal particles is not sufficiently high, a polyoxyalkyleneamine containing an oxy group having a higher polarity than an alkyl group in the alkylamine may be further applied to the surfaces of the ultrafine metal particles prior to mixing of the ultrafine metal particles with the resin component. That is, it is also preferred to improve dispersion stability by replacing the compound which coats the surfaces of the ultrafine metal particles with a compound which shows a good affinity for the resin component such as a thermosetting resin that is used as an organic binder. As a result, no gradual precipitation and agglomeration of the ultrafine metal particles dispersed in the resin composition occurs while the mixture is left to stand, and thereby a uniform dispersion system with further excellent stability can be attained. A monoamine, a diamine or a triamine thereof, which has one, two or three amino groups for substitution at the terminal in total respectively, may be used. Use of the diamine or triamine thereof, particularly the triamine, is preferred because smoothness obtained thereby after the paste is heat-cured is better.

For example, further action of an amine compound having a good affinity for the resin composition such as a thermosetting resin on the surfaces of the ultrafine metal particles to apply to the coating layer thereon in addition to the alkylamine exhibits effect on improved affinity for the varnish-like resin composition containing the thermosetting resin or thermoplastic resin. As for the proportion of the alkylamine in all amine compounds, it is preferred that the amount of an amino group derived from the alkylamine is at least selected to be 0.1 mol % or more of a total of all amino groups in the amine compounds.

In the conductive metal paste of the present invention, a resin component acting as an organic binder is contained in a varnish-like resin composition as an essential component. When the conductive metal paste of the present invention is heat-cured, the resin component has effects of fixing metal fillers contained therein to each other, bringing ultrafine metal particles filling gaps between the metal fillers into contact with each other and imparting adhesive properties to a substrate. Thus, an organic binder, such as thermosetting resin, thermoplastic resin or thermally decomposable resin, used in a general conductive metal paste can be used. For example, according to target temperature for heat-curing, one or more resin components which can be cured to a sufficient extent by a heat treatment at the temperature may be selected from the following exemplary resin components for use. Firstly, examples of the thermosetting resin include a phenol resin, an epoxy resin, an unsaturated polyester resin, a vinyl ester resin, a diallyl phthalate resin, an oligoester acrylate resin, a xylene resin, a bismaleimide triazine resin, a furan resin, an urea resin, a polyurethane resin, a melamine resin, a silicone resin, an acrylic resin (containing an oligomer and showing thermosetting), an oxetane resin, and an oxazine resin. Of these, the phenol resin, the epoxy resin and the oxazine resin are more preferable as the resin component because they show good adhesive force in formation of a superfine circuit and, of course, cured product physical properties thereof are suitable for the conductive paste. Further, examples of the thermoplastic resin include a polyamide resin, a polyimide resin, an acrylic resin, a ketone resin, and a polystyrene resin. The thermoplastic resin is dissolved in a proper solvent to be comprised in the varnish-like resin composition. Examples of the thermally decomposable resin include cellulose resins such as a cellulose ester and cellulose ether, and a polyacrylonitrile. The thermally decomposable resin is also dissolved in a proper solvent to be comprised in the varnish-like resin composition. When the conductive paste is print-coated on a circuit pattern or the like and then heated to remove the solvent through evaporation and then solidified by cooling, the paste forms into a cured product in which the thermoplastic resin serves as a binder. Of thermoplastic resins, the polyamide resin, the polyimide resin, and the acrylic resin can be suitably used because they show good adhesive force in formation of a superfine circuit and physical properties thereof after solidification are also suitable for the conductive paste. Further, in addition to the resin component acting as an organic binder, for the purpose of improving adhesive force to a surface as of a printed substrate, the varnish-like resin composition may comprise proper amounts of such components as a silane coupling agent, a titanium coupling agent, a glass resin and a glass frit according to the subjected base. Further, a leveling agent that is generally used in a conductive paste may also be added as required. In addition, to obtain a conductive paste having viscosity advantageous to its coating activity, a diluting solvent may be added to the varnish-like resin composition in advance.

The content of these resin components contained in the varnish-like resin composition may be selected as appropriate according to the total bulk of the metal fillers and the ultrafine metal particles and the proportion of gap spaces present among these particles. In general, its content is selected from a range of 5 to 100 parts by weight, preferably of 5 to 30 parts by weight, based on 100 parts by weight of a total of the metal fillers and ultrafine metal particles used in combination. In addition to the resin component acting as an organic binder, the varnish-like resin component also comprises the aforementioned compound component, such as an acid anhydride or acid anhydride derivative, having reactivity with a group containing a nitrogen, oxygen or sulfur atom when heated with the compound having the group containing a nitrogen, oxygen or sulfur atom. As described above, the compound component having reactivity with the group containing the nitrogen, oxygen or sulfur atom, such as an acid anhydride or acid anhydride derivative, is primarily used to remove the coating layer covering the surfaces of the ultrafine metal particles, which is composed of the compound having the group containing the nitrogen, oxygen or sulfur atom such as an amine compound. However, when the resin component used is an epoxy resin or the like, the compound component may act as a curing agent therefor. In that case, since the acid anhydride or acid anhydride derivative is used to react with the amine compound such as an alkylamine so as to form an amide and also consumed as a curing agent for the epoxy resin or the like at the time of heat-curing, the acid anhydride or acid anhydride derivative may be used in an amount larger than an amount determined in accordance with the rule for the total of terminal amino groups contained in the amine compounds described above. Further, since the terminal amino groups of the amine compound also react with the epoxy resin or the like, the content of the acid anhydride or acid anhydride derivative is selected as appropriate according to the type and content of the amine compounds used such as an alkylamine and further in consideration of the type and reactivity of the resin component used therewith.

In addition, the conductive metal paste of the present invention is suitably used in the form of a mixture in which the metal fillers having large particle diameters are densely dispersed in a paste-like dispersion comprising the ultrafine metal particles dispersed with sufficient uniformity in the varnish-like resin composition. It is preferable to prepare a conductive metal paste of target composition by prefroming said paste-like dispersion first and then adding the metal fillers thereto.

Further, in a case where the acid anhydride or acid anhydride derivative is also consumed as a curing agent for an epoxy resin or the like, when the content (moles) of the acid anhydride or acid anhydride derivative derived from a dibasic acid is significantly lower than ½ of the total content (moles) of amine groups contained, a portion of said amine compounds such as alkylamines remain unreacted, so that the electric characteristics of a heat-cured product may be influenced. That is, if the coating layer made of the amine compounds, which covers the surfaces of the ultrafine metal particles, is not fully removed when heated, fusion of the ultrafine metal particles does not proceed sufficiently, which may interfere with achievement of high conductivity in the ultrafine metal particles that are filling gaps among the metal fillers. Hence, for example, in the case of a conductive metal paste in which the content (moles) of an organic acid anhydride or derivative thereof is significantly lower than ½ of the total content (moles) of contained amine groups, e.g., lower than ¼, the electric resistance of a heat-cured product cured at a low temperature of 250° C. or lower may not become sufficiently low, and in some cases its volumetric electric resistivity may remain $10^{-4}$ Ω·cm or higher.

Upon heat treatment, the organic acid anhydride or derivative thereof contained reacts with, for example, the amine compound such as an alkylamine so as to produce an amide, and the ring-opening of an acid anhydride structure in its molecule occurs. After the ring-opening, a generated carboxy group also reacts with the alkylamine covering the surfaces of the ultrafine metal particles to form an amide. Similarly, reaction with various organic acids forms amides. As a result, the amine compound such as the alkylamine coating the surfaces of the ultrafine metal particles is removed, the coating layers for suppressing agglomeration of the ultrafine metal particles vanish, and then fusion and agglomeration of the ultrafine metal particles proceed gradually, which forms random chains thereof eventually. In that case, as the ultrafine metal particles filling gaps among the metal fillers contact with one another at their clean surfaces, the subsequent volume shrinkage of the whole resin composition leads to achieved intimate contact of these random chains. Due to the effect, when the heat treatment temperature is selected to be 300° C. or lower, preferably 250° C. or lower, generally 180 to 230° C., a heat-treated cured product (heat-cured product) obtained has very low resistance, for example, a volumetric electric resistivity of not higher than $10^{-5}$ Ω·cm. In addition, the ultrafine metal particles form a surface with no roughness by filling up smoothly over the metal fillers, in addition to the gaps among the metal fillers. Although slight volume shrinkage occurs in the ultrafine metal particle layer covering over the top surface of a packed layer of the metal fillers along with a subsequent heat treatment, a circuit pattern having a smooth surface flattened by covering over initial roughness of the stacked layer of the metal filler with the ultrafine metal particle layer is obtained.

To prepare the conductive metal paste of the present invention having the constitution described above, a paste having the ultrafine metal particles dispersed uniformly therein is prepared, the metal fillers are then added to the paste, and the mixture is kneaded into a uniform mixture. As required, to adjust the viscosity of the paste according to a coating method, further addition of an thixotropic agent used in a conductive metal paste, removal of an excessive organic solvent by distillation under a reduced pressure or addition of an organic solvent can also be carried out as appropriate. Particularly, even if a polar solvent which can be generally used for dilution of the varnish-like resin composition contained in the conductive metal paste other than the nonpolar solvent and low-polar solvent mentioned above is used as an organic solvent added for dilution, a good dispersion state of the contained ultrafine metal particles can be maintained, as long as the polar solvent is added after the treatment of adding and applying various amine compounds on the surfaces of the ultrafine metal particles have been completed.

In the low-temperature sintering conductive metal paste for superfine circuit printing according to the second aspect of the present invention, ultrafine metal particles having an average particle diameter of 1 to 100 nm are used as a conductive medium. For common use of a conductive metal paste, the average particle diameter of the ultrafine metal particles is not required to be very small and is desirably selected from a range of 2 to 10 nm.

In a cured product by heat-treating (heat-cured product) formed by use of the low-temperature sintering conductive metal paste of the present invention, dominant factor governing the conductivity (resistance) of the whole cured product is resistance at a contact surface between the ultrafine metal particles which fill the gaps between the metal fillers so as to achieve good electric contact therebetween, and the conductivity of each ultrafine metal particle itself is a secondary factor. Hence, although a metal constituting each ultrafine metal particle itself is not particularly limited, it is preferred for attaining such an average particle diameter of 10 nm or smaller that it be one metal or more selected from noble metals, copper, tungsten, nickel, tantalum, bismuth, lead, indium, tin, zinc, and titanium, typically one metal selected from silver, gold, copper, platinum, palladium, rhodium, osmium, ruthenium, iridium, tungsten, nickel, tantalum, bismuth, lead, indium, tin, zinc, and titanium. Since high conductivity is required for forming such a circuit pattern, ultrafine metal particles comprising a noble metal (i.e., silver, gold, platinum, palladium, rhodium, osmium, ruthenium or iridium) or copper are more preferably used. Of these, silver, gold and copper are more suitably used due to good conductivity. In addition, silver, gold and copper are also more suitable in the following respect as well. That is, when volume shrinkage of the thermosetting resin caused by its curing is used as means for bringing the ultrafine metal particles into contact with each other at the time of sintering and heat-curing the paste, the contact areas of the ultrafine metal particles can be easily expanded because silver, gold and copper have high expansability. The conductive metal paste of the present invention preferably uses ultrafine metal particles having an average particle diameter of not larger than 10 nm, and further even if ultrafine metal particles having an average particle diameter of about 20 nm are used, a paste being formulated in similar composition may be also a low-temperature curable conductive metal paste for superfine circuit printing which can form a fine circuit having good adhesive force, a smooth surface and low resistance when applied on a substrate and sintered.

In general, the ultrafine metal particles with an average particle diameter of about several nanometers to several tens of nanometers are known to be easily sintered at a temperature which is much lower than their melting point (for example, at a temperature of 200° C. or lower in the case of ultrafine silver particles having clean surfaces). The reason for such low temperature sintering is as follows. That is, as the particle diameters of the ultrafine metal particles are reduced to a sufficient extent, a proportion of atoms in a state of high energy becomes large with respect to total of the atoms present on the surfaces of the particles and the surface diffusion of the metal atoms becomes considerably large, with the result that interfaces between the particles are expanded due to the surface diffusion and thus the particles are sintered. Meanwhile, this characteristic causes a phenomenon that the ultrafine metal particles form agglomerations when surfaces thereof make direct contact with one another even around room temperature. An improvement in uniformity of thickness in the present invention is achieved as a result of formation of a densely packed state of the ultrafine metal particles, but said formation of agglomerations causes an impairment of the improvement in uniformity of thickness. Further, the formation of the densely packed state effects desired conductivity as a whole, but when a structure in which agglomerations are formed in portions thereof in advance is mixed in, it may be one of the factors interfering with achievement of such a close-packed state with high reproducibility.

As in the case of the low-temperature sintering conductive metal paste for high density circuit printing which is the first aspect of the present invention described above, the low-temperature sintering conductive metal paste for superfine circuit printing which is the second aspect of the present invention adopts the following constitution. That is, as means for suppressing the formation of agglomerations of the ultrafine metal particles around room temperature and making possible low-temperature sintering of the ultrafine metal particles at the step of a heat treatment (such as heat-curing), the surfaces of the ultrafine metal particles are coated with one compound or more which has a group containing a nitrogen, oxygen or sulfur atom and capable of coordinate-bonding by lone pairs existing in these atoms as a group capable of coordinate-bonding to a metal element contained in the ultrafine metal particle. Meanwhile, in a varnish-like resin composition, a compound component which has reactivity with the group containing a nitrogen, oxygen or sulfur atom when heated with the compound having the group containing the nitrogen, oxygen or sulfur atom is added.

The compound which is used for coating the surfaces of the ultrafine metal particles and has a group containing a nitrogen, oxygen or sulfur atom and capable of coordinate-bonding by lone pairs existing in these atoms as a group capable of coordinate-bonding to a metal element is essentially the same as that described for the first aspect of the present invention. In addition, the compound component which has reactivity with a group containing a nitrogen, oxygen or sulfur atom when heated with the compound having the group containing the nitrogen, oxygen or sulfur atom is also essentially the same as that described for the first aspect of the present invention.

Further, the content of the compound having the group containing the nitrogen, oxygen or sulfur atom and the content of the compound component which has reactivity with the group containing the nitrogen, oxygen or sulfur atom are selected according to ultrafine metal particles used, and proportions thereof are essentially the same as those described for the first aspect of the present invention.

The surfaces of the ultrafine metal particles comprised in the conductive metal paste of the present invention are set in the state of being coated with one compound or more which has a group containing a nitrogen, oxygen or sulfur atom and capable of coordinate-bonding by lone pairs existing in these atoms as a group capable of coordinate-bonding to a metal element contained in the ultrafine metal particle. For example, it is preferred that the surfaces thereof are set in the state of being coated with at one amine compound or more having one or more terminal amino groups. For example, when the conductive metal paste is prepared, it may be set in the state where the one or more amine compounds are comprised in a total amount of 0.1 to 60 parts by weight based on 100 parts by weight of the ultrafine metal particles. It may be set in the state where the one or more amine compounds are comprised preferably in a total amount of 0.5 to 30 parts by weight, more preferably of 1 to 10 parts by weight, based on 100 parts by weight of the ultrafine metal particles.

A first effect of said amine compound contained in the conductive metal paste of the present invention is to form a coating layer on the surfaces of the ultrafine metal particles so as to prevent the ultrafine metal particles from directly contacting their clean surfaces with one other, sticking to one another and then forming agglomerations, at the step of kneading the varnish-like resin composition by stirring and mixing in the process of preparing the paste. Hence, although the compound used is not limited to a particular type as long as it can form the coating layer on the surface of the ultrafine metal particle, such a compound that is not liable to evaporate at room temperature is desirable. Therefore, as described above, an amine compound having terminal amino groups such as an alkylamine is preferably used. More specifically, as for the alkylamine, a $C_4$ to $C_{20}$ alkyl group is usable, more preferably selected from a range of $C_8$ to $C_{18}$, and those having an amino group at terminals of their alkyl chain are usable. For example, since said alkylamine selected from a range of $C_8$ to $C_{18}$ has thermal stability and its vapor pressure is not so high, it is also easy to keep and control its content within a desired range during storage at room temperature or the like, and therefore such an alkylamine is suitably used due to its ease of handling. To achieve the first effect of forming the coating layer on the surface of the ultrafine metal particle, the content of the compound having an amino group at terminals such as an alkylamine should be selected as appropriate in consideration of the total surface area of the ultrafine metal particles, the type of the metal, and the type of the amine compound such as an alkylamine. In general, in a case where the $C_8$ to $C_{18}$ alkylamine is used, the specific gravity of the metal itself is comparable to that of silver, gold or copper, and the average particle diameter of the ultrafine metal particles is not extremely smaller than 10 nm, it is preferred that the content of the alkylamine in a dispersion comprising the colloid thereof, though varying depending on the type of the metal and the particle diameter, is selected from a range of 0.1 to 60 parts by weight, preferably of 0.5 to 30 parts by weight, more preferably of 1 to 10 parts by weight, based on 100 parts by weight of the ultrafine metal particles. When an amine compound other than the alkylamine is used together therewith, it is also preferred that the total content of the amine compounds is selected from a range of 0.1 to 60 parts by weight, preferably of 0.5 to 30 parts by weight, more preferably of 1 to 10 parts by weight, based on 100 parts by weight of the ultrafine metal particles.

An organic solvent contained in the conductive metal paste of the present invention has a function of a solvent in preparing the varnish-like resin composition by kneading. Further, as explained below, when the ultrafine metal particle used therein is preformed in the form of that attached with the coating layer composed of amine compounds such as alkylamines on its surface and another amine compounds are further added to the amine compounds such as alkylamines forming themselves into the coating layer so as to apply the other amine compound to the coating layer on the surface of the ultrafine metal particle, the organic solvent is also used as a solvent for carrying out the treatment. Thus, as for the organic solvent used for these two purposes, the same organic solvent can be used, or different organic solvents may be also used. The organic solvent is not limited to a particular type as long as it is applicable for said two types of uses. It is preferable to select a nonpolar solvent or low polar solvent, rather than a high polar solvent in which the compound forming the coating layer on the surfaces of the ultrafine metal particles, for example, an amine compound such as an alkylamine, or another amine compound to be applied later is so highly soluble that the coating layer on the surfaces of the ultrafine metal particles may vanish away. In addition, it is preferred that the organic solvent has thermal stability to such an extent that does not undergo thermal decomposition even at a temperature where a heat treatment such as heat-curing of the conductive metal paste of the present invention is carried out in its application to actual use. Further, at the step of applying the conductive metal paste to form fine lines, the viscosity of the conductive metal paste must be kept within a desired liquid viscosity, and in consideration of its ease of handling at such a step, a nonpolar solvent or low polar solvent with a relatively high boiling point which hardly evaporates around room temperature, for example, such as terpineol, a mineral spirit, xylene, toluene, tetradecane or dodecane, is suitably used.

For example, a dispersion in which ultrafine metal particles attached with alkylamines as a coating layer on surfaces thereof are dispersed in a nonpolar solvent or low polar solvent having a relatively high boiling point is very stable and shows good workability when handled, but it is low in polarity as a whole. Hence, when the dispersion is mixed with the thermosetting resin component and the organic acid anhydride derivative thereof or organic acid so as to disperse the ultrafine metal particles in the varnish-like resin composition, if the resin component itself has a poor affinity for the alkylamine present as the coating layer on the surfaces of the ultrafine metal particles, the ultrafine metal particles coated with the alkylamine tend to gradually precipitate down and agglomerate when left to stand. Further, when the mixture comprising the ultrafine metal particles that have precipitated down and agglomerated is print-coated and heat-cured, the surface obtained thereby cannot be smooth always, which is not suitable for high-density printing.

In the conductive metal paste of the present invention, for example, when the affinity of the resin component itself for the alkylamine present as the coating layer on the surfaces of the ultrafine metal particles is not sufficiently high, a polyoxyalkyleneamine containing an oxy group having a higher polarity than an alkyl group in the alkylamine may be further applied to the surfaces of the ultrafine metal particles prior to mixing of the ultrafine metal particles with the resin component. That is, it is also preferred to improve dispersion stability by replacing the compound which coats the surfaces of the ultrafine metal particles with a compound which shows a good affinity for the resin component such as a thermosetting resin that is used as an organic binder. As a result, no gradual precipitation and agglomeration of the ultrafine metal particles dispersed in the resin composition occurs while the mixture is left to stand, and thereby a uniform dispersion system with further excellent stability can be attained. Hence, as for the polyoxyalkyleneamine used, a compound that has amino groups at terminals thereof as in the case of the alkylamine and a polyether skeleton containing a plurality of oxyalkylene units therein is desirably used. The polyether skeleton is preferably composed of oxyalkylene units derived from propyleneoxide or from ethyleneoxide, or of a mixture of these two types of oxyalkylene units. A monoamine, a diamine or a triamine thereof, which has one, two or three amino groups for substitution at the terminal in total respectively, may be used. Use of the diamine or triamine thereof, particularly the triamine, is preferred because smoothness obtained thereby after the paste is heat-cured is better.

Further action of the polyoxyalkyleneamine on the surfaces of the ultrafine metal particles to apply to the coating layer thereon in addition to the alkylamine exhibits effect on improved affinity for the thermosetting resin or thermoplastic resin as mentioned above. The polyether skeleton constituting the polyoxyalkyleneamine has ether oxygen (oxy group: —O—) from, for example, an oxypropylene unit or oxyethylene unit, and thus, the polyoxyalkyleneamine has a significantly higher affinity for a thermosetting or thermoplastic resin having a structure in which a portion of polymerized chain has polarity, than that of an alkyl group in an alkylamine. Meanwhile, its characteristic in binding onto the surface of the metal is given by use of the terminal amino groups thereof, and in principle, its mechanism is the same as that of the alkylamine. As in the case of the alkylamine, the content of the polyoxyalkyleneamine should be selected appropriately in accordance with the total surface areas of the ultrafine metal particles and in consideration of the type of the metal and the type of the polyoxyalkyleneamine. Since the procedure generally used comprises the step of further applying and attaching polyoxyalkyleneamine on the surfaces of the ultrafine metal particles to which the alkylamine has been already stuck, it is preferable that the content of the polyoxyalkyleneamine be selected from a given range based on the content of the alkylamine. In general, it is desirable that the content of the polyoxyalkyleneamine be selected from a range of 15 to 80 wt %, preferably of 30 to 60 wt % of the content of the alkylamine. Alternatively, the content of the polyoxyalkyleneamine, though varying depending on the type of the polyoxyalkyleneamine, is preferably selected from a range of 0.1 to 48 parts by weight, more preferably of 1.5 to 18 parts by weight, based on 100 parts by weight of the ultrafine metal particles.

In the conductive metal paste of the present invention, a resin component acting as an organic binder is contained in a varnish-like resin composition as a main component. When the conductive metal paste of the present invention is heat-cured, the resin component has effects of bringing ultrafine metal particles contained therein into contact with each other and imparting adhesive properties to a substrate. Thus, an organic binder, such as thermosetting resin, thermoplastic resin or thermally decomposable resin, used in a general conductive metal paste can be used. For example, according to target temperature for heat-curing, one or more resin components which can be cured to a sufficient extent by a heat treatment at the temperature may be selected from the following exemplary resin components for use. Firstly, examples of the thermosetting resin include a phenol resin, an epoxy resin, an unsaturated polyester resin, a vinyl ester resin, a diallyl phthalate resin, an oligo-ester acrylate resin, a xylene resin, a bismaleimide triazine resin, a furan resin, an urea resin, a polyurethane resin, a melamine resin, a silicone resin, an acrylic resin (containing an oligomer and showing thermosetting), an oxetane resin, and an oxazine resin. Of these, the phenol resin, the epoxy resin and the oxazine resin are more preferable as the resin component because they show good adhesive for the coductive paste.

Further, examples of the thermoplastic resin include a polyamide resin, a polimide resin, an arcrylic resin, a ketone resin, and a polystyrene resin. The thermoplastic resin is dissolved in a proper solvent to be comprised in the varnish-like resin composition. Examples of the thermally decomposable resin include cellulose resins such as a cellulose ester and cellulose ether, and a polyacrylonitrile. The thermally decomposable resin is also dissolved in a proper solvent to be comprised in the varnish-like resin composition. When the conductive paste is print-coated on a circuit pattern or the like and then heated to remove the solvent through evaporation and then solidified by cooling, the paste forms into a cured product in which the thermoplastic resin serves as a binder. Of thermoplastic resins, the polyamide resin, the polyimide resin, and the acrylic resin can be suitable used because they show good adhesive force in formation of a superfine circuit and physical properties thereof after solidification are also suitable for the conductive paste. Further, in addition to the resin component acting as an organic binder, for the purpose of improving adhesive force to a surface as of a printed substrate, the varnish-like resin composition may comprise proper amounts of such components as a silane coupling agent, a titanium coupling agent, a glass resin and a glass frit according to the subjected base. Further, a leveling agent that is generally used in a conductive paste may also be added as required. In addition, to obtain a conductive paste having viscosity advantageous to its coating activity, a diluting solvent may be added to the varnish-like resin composition in advance.

The content of these resin components contained in the varnish-like resin composition may be selected as appropriate according to the total bulk of the ultrafine metal particles and the proportion of gap spaces present among these particles. In general, its content is selected from a range of 1 to 30 parts by weight, preferably of 3 to 20 parts by weight, based on 100 parts by weight of the ultrafine metal particles.

In addition to the resin component acting as an organic binder, the varnish-like resin component also comprises the aforementioned compound component, such as an acid anhydride or acid anhydride derivative, having reactivity with a group containing a nitrogen, oxygen or sulfur atom when heated with the compound having the group containing a nitrogen, oxygen or sulfur atom. As described above, the compound component having reactivity with the group containing the nitrogen, oxygen or sulfur atom, such as an acid anhydride or acid anhydride derivative, is mainly used to remove the coating layer covering the surfaces of the ultrafine metal particles, which is composed of the compound having the group containing the nitrogen, oxygen or sulfur atom such as an amine compound. However, when the resin component used is an epoxy resin or the like, the compound component may act as a curing agent therefor. In that case, since the acid anhydride or acid anhydride derivative is used to react with the amine compound such as an alkylamine so as to form an amide and also consumed as a curing agent for the epoxy resin or the like at the time of heat-curing, the acid anhydride or acid anhydride derivative may be used in an amount larger than an amount determined in accordance with the rule for the total of terminal amino groups contained in the amine compounds described above.

Further, since the terminal amino groups of the amine compound also react with the epoxy resin or the like, the content of the acid anhydride or acid anhydride derivative is selected as appropriate according to the type and content of the amine compounds used such as an alkylamine and further in consideration of the type and reactivity of the resin component used therewith.

Further, in a case where the acid anhydride or acid anhydride derivative is also consumed as a curing agent for an epoxy resin or the like, when the content (moles) of the acid anhydride or acid anhydride derivative derived from a dibasic acid is significantly lower than ½ of the total content (moles) of amine groups contained, a portion of said alkylamines and polyoxyalkyleneamine remain unreacted, so that the electric characteristics of a heat-cured product may be influenced. For example, in the case of a conductive metal paste in which the content (moles) of an organic acid anhydride or derivative thereof is significantly lower than ½ of the total content (moles) of contained amine groups, the electric resistance of a heat-cured product cured at a low temperature of 250° C. or lower may not become sufficiently low, and in come cases its volumetric electric resistivity may remain $10^{-4}$ Ω·cm or higher.

Upon heat treatment, the organic acid anhydride or derivative thereof contained reacts with, for example, an alkylamine or polyoxyalkyleneamine so as to produce an amide, and the ring-opening of an acid anhydride structure in its molecule occurs. After the ring-opening, a generated carboxy group also reacts with the alkylamine or polyoxyalkyleneamine covering the surfaces of the ultrafine metal particles to form an amide. Similarly, reaction with various organic acids forms amides.

As a result, the alkylamine and polyoxyalkyleneamine coating the surfaces of the ultrafine metal particles is removed, the coating layers for suppressing agglomeration of the ultrafine metal particles vanish, and then fusion and agglomeration of the ultrafine metal particles proceed gradually, which forms random chains thereof eventually. In that case, as the ultrafine metal particles contact with one another at their clean surfaces, the subsequent volume shrinkage of the whole resin composition leads to achieved intimate contact of these random chains.

Due to the effect, when the heat treatment temperature is selected to be 300° C. or lower, preferably 250° C. or lower, generally 180 to 230° C., a heat-treated cured product (heat-cured product) obtained has very low resistance, for example, a volumetric electric resistivity of not higher than $10^{-4}$ Ω·cm, and a circuit pattern is obtained thereby that has a smooth surface which is free from roughness in surface reflecting non-uniform agglomerations of the ultrafine metal particles.

To prepare the conductive metal paste of the present invention having the constitution described above, a paste having the ultrafine metal particles dispersed uniformly therein is prepared at first. As required, to adjust the viscosity of the paste, further addition of an thixotropic agent used in a conductive metal paste, removal of an excessive organic solvent by distillation under a reduced pressure or addition of an organic solvent can also be carried out as appropriate. Particularly, even if a polar solvent which can be generally used for dilution of the varnish-like resin composition contained in the conductive metal paste other than the nonpolar solvent and low-polar solvent mentioned above is used as an organic solvent added for dilution, a good dispersion state of the ultrafine metal particles can be maintained, as long as the polar solvent is added after the treatment of adding and applying polyoxyalkyleneamine on the surfaces of the ultrafine metal particles have been completed.

EXAMPLES

Hereinafter, the present invention will be explained more specifically with reference to Examples. Although these Examples are examples of the best embodiments in the present invention, the present invention shall not be limited by these Examples.

Example 1-1

A commercially available ultrafine silver particle dispersion (product name: individually dispersed ultrafine particles AgIT, ULVAC CORPORATION), more specifically, a dispersion of ultrafine silver particles having an average particle diameter of 3 nm which comprised 35 parts by weight of ultrafine silver particles, 1 part by weight of dodecylamine (molecular weight: 185.36, boiling point: 248° C.) as an alkylamine and 58 parts by weight of toluene as an organic solvent was used. Further, to prepare a conductive metal paste, 73 parts by weight of silver particles having an average particle diameter of 10 μm was also used as metal fillers based on 18 parts by weight of the silver particles contained in the ultrafine silver particle dispersion. As the silver particles having an average particle diameter of 10 μm, a commercially available surface-treated silver powder (product name: SPN10JF, MITSUI MINING & SMELTING CO., LTD.) was used.

Firstly, the above ultrafine silver particle dispersion 35 wt % AgIT was charged into a reactor in such an amount that ensured that 18 parts by weight of the ultrafine silver particles would be contained, i.e., 18×(100/35) parts by weight, and 4.4 parts by weight of NSA (nonenylsuccinic anhydride having a molecular weight of 224) as an acid anhydride, 0.9 parts by weight of dicyclohexylamine (molecular weight: 181.3, boiling point: 256° C.) and 1.8 parts by weight of pentamethyldiethylenetriamine (molecular weight: 173.3, boiling point: 198° C.) as additional amine compounds, and 0.5 parts by weight of novolac phenolic resin (product of Gun'ei Chemical Industry Co., Ltd., RESITOP PS-2608) as a thermosetting resin were also added. After they were mixed together and stirred, low boiling point components were distilled off by means of an evaporator under heating so as to prepare a paste having the ultrafine silver particles dispersed uniformly therein and having a total amount of 25.6 parts by weight.

Next, to 25.6 parts by weight of the prepared paste having the ultrafine silver particles dispersed uniformly therein, 73 parts by weight of surface-treated silver powder SPN10JF (MITSUI MINING & SMELTING CO., LTD.) having an average particle diameter of 10 μm was added, and they were fully stirred and mixed together to prepare a conductive metal paste. The prepared conductive metal paste was applied on a glass substrate by use of a metal mask to a film thickness of 40 μm and a size of 10 mm in length and 50 mm in width. After its surface condition (occurrence of agglomeration) was checked, the applied paste was allowed to cure at 200° C. for 60 minutes.

Table 1-1 shows the composition of the conductive metal paste, a surface condition (occurrence of agglomeration) after application of the paste, and the result of evaluation of volume resistivity of the heat-cured product obtained. The ratio of a total of the amine compounds contained in the above conductive metal paste, i.e., dodecylamine, dicyclohexylamine and pentamethyldiethylenetriamine, to the acid anhydride NSA (nonenylsuccinic anhydride) is a ratio of a ½ molecule of the acid anhydride per one amino group.

Example 1-2

To prepare a conductive metal paste, the ultrafine silver particle dispersion (AgIT) described in Example 1-1 was used, and 73 parts by weight of silver particles having an average particle diameter of 1 μm was also used as metal fillers based on 18 parts by weight of the ultrafine silver particles having an average particle diameter of 3 nm dispersed therein. As the silver particles having an average particle diameter of 1 μm, a commercially available surface-treated silver powder (product name: SPQ03S, MITSUI MINING & SMELTING CO., LTD.) was used.

In accordance with the composition and procedure described in Example 1-1, a paste having 18 parts by weight of the ultrafine silver particles dispersed uniformly therein was prepared in a total amount of 25.6 parts by weight in advance. Then, to 25.6 parts by weight of the prepared paste having the ultrafine silver particles dispersed uniformly therein, 73 parts by weight of the surface-treated silver powder SPQ03S (MITSUI MINING & SMELTING CO., LTD.) having an average particle diameter of 1 μm was added, and they were fully stirred and mixed together to prepare a conductive metal paste. The prepared conductive metal paste was applied on a glass substrate by use of a metal mask to a film thickness of 40 μm and a size of 10 mm in length and 50 mm in width. After its surface condition (occurrence of agglomeration) was checked, the applied paste was allowed to cure at 200° C. for 60 minutes.

Table 1-1 shows the composition of the conductive metal paste, a surface condition (occurrence of agglomeration) after application of the paste, and the result of evaluation of volume resistivity of the heat-cured product obtained. Further, as in the case of Example 1-1, the ratio of a total of the amine compounds contained in the prepared conductive metal paste, i.e., dodecylamine, dicyclohexylamine and pentamethyldiethylenetriamine, to the acid anhydride NSA (nonenylsuccinic anhydride) is a ratio of a ½ molecule of the acid anhydride per one amino group.

Comparative Example 1-1

A conventional conductive metal paste using only silver particles having an average particle diameter of 10 μm as a conductive medium was prepared.

Firstly, to a reactor, 4.4 parts by weight of NSA (nonenylsuccinic anhydride), 0.9 parts by weight of dicyclohexylamine, 1.8 parts by weight of pentamethyldiethylenetriamine, and 0.5 parts by weight of novolac phenol resin (product of Gun'ei Chemical Industry Co., Ltd., RESITOP PS-2608) as a thermosetting resin were added. They were mixed and stirred to prepare a resin composition in a total amount of 7.6 parts by weight.

To 7.6 parts by weight of the resin composition, 91 parts by weight of surface-treated silver powder SPN10JF (MITSUI MINING & SMELTING CO., LTD.) having an average particle diameter of 10 μm was added, and they were fully stirred and mixed together to prepare a conductive metal paste. The prepared conductive metal paste was applied on a glass substrate by use of a metal mask to a film thickness of 40 μm and a size of 10 mm in length and 50 mm in width. After its surface condition (occurrence of agglomeration) was checked, the applied paste was allowed to cure at 200° C. for 60 minutes.

Table 1-1 shows the composition of the conductive metal paste, a surface condition (occurrence of agglomeration) after application of the paste, and the result of evaluation of volume resistivity of the heat-cured product obtained.

Comparative Example 1-2

A conventional conductive metal paste using only silver particles having an average particle diameter of 1 μm as a conductive medium was prepared.

Firstly, to a reactor, 4.4 parts by weight of NSA (nonenylsuccinic anhydride), 0.9 parts by weight of dicyclohexylamine, 1.8 parts by weight of pentamethyldiethylenetriamine, and 0.5 parts by weight of novolac phenol resin (product of Gun'ei Chemical Industry Co., Ltd., RESITOP PS-2608) as a thermosetting resin were added. They were mixed and stirred to prepare a resin composition in a total amount of 7.6 parts by weight.

To 7.6 parts by weight of the resin composition, 91 parts by weight of surface-treated silver powder SPQ03S (MITSUI MINING & SMELTING CO., LTD.) having an average particle diameter of 1 μm was added, and they were fully stirred and mixed together to prepare a conductive metal paste. The prepared conductive metal paste was applied on a glass substrate by use of a metal mask to a film thickness of 40 μm and a size of 10 mm in length and 50 mm in width. After its surface condition (occurrence of agglomeration) was checked, the applied paste was allowed to cure at 200° C. for 60 minutes.

Table 1-1 shows the composition of the conductive metal paste, a surface condition (occurrence of agglomeration) after application of the paste, and the result of evaluation of volume resistivity of the heat-cured product obtained.

Comparative Example 1-3

A conventional conductive metal paste using silver particles having an average particle diameter of 1 μm in addition to silver particles having an average particle diameter of 10 μm as conductive media was prepared.

Firstly, to a reactor, 4.4 parts by weight of NSA (nonenylsuccinic anhydride), 0.9 parts by weight of dicyclohexylamine, 1.8 parts by weight of pentamethyldiethylenetriamine, and 0.5 parts by weight of novolac phenol resin (product of Gun'ei Chemical Industry Co., Ltd., RESITOP PS-2608) as a thermosetting resin were added. They were mixed and stirred to prepare a resin composition in a total amount of 7.6 parts by weight.

To 7.6 parts by weight of the resin composition, 18 parts by weight of surface-treated silver powder SPQ03S (MITSUI MINING & SMELTING CO., LTD.) having an average particle diameter of 1 μm and 73 parts by weight of surface-treated silver powder SPN10JF (MITSUI MINING & SMELTING CO., LTD.) having an average particle diameter of 10 μm were added, and they were fully stirred and mixed together to prepare a conductive metal paste. The prepared conductive metal paste was applied on a glass substrate by use of a metal mask to a film thickness of 40 μm and a size of 10 mm in length and 50 mm in width. After its surface condition (occurrence of agglomeration) was checked, the applied paste was allowed to cure at 200° C. for 60 minutes.

Table 1-1 shows the composition of the conductive metal paste, a surface condition (occurrence of agglomeration) after application of the paste, and the result of evaluation of volume resistivity of the heat-cured product obtained.

Table 1-1 summarizes the results of Examples 1-1 and 1-2 and Comparative Examples 1-1 to 1-3. Comparative studying the results shown in Table 1-1, it is understood from the results of Examples 1-1 and 1-2 and Comparative Examples 1-1 to 1-3 that the conductive metal pastes using a combination of the silver powder having an average particle diameter of not smaller than 1 μm and the ultrafine silver particles having an average particle diameter of at least not larger than 100 nm achieve significantly reduced volume resistivity in the heat-cured products as compared with the conductive metal pastes using only the silver powder having an average particle diameter of not smaller than 1 μm as a conductive medium. Further, although there is a slight difference between the volume resistivities in the cured products of Examples 1-1 and 1-2 due to a difference between the metal fillers, i.e., between the average particle diameters of the silver powders used, it is believed that there is no essential difference between Examples 1-1 and 1-2 in terms of an effect of reducing the volume resistivity in the cured product by use of the ultrafine metal particles having at least not larger than 100 nm in combination with the silver powders.

In addition, in the case of the conventional conductive metal pastes using only the silver powders having an average particle diameter of not smaller than 1 μm, it is observed that areas with insufficient surfacial flatness which result from irregular agglomeration of the contained metal fillers are scattered over the surface of the film immediately after application of the paste. Meanwhile, in the case of Examples 1-1 and 1-2, it is concluded that the surfacial flatness of the film immediately after application of the paste is good and its uniform dispersive state is maintained throughout the film due to combinational use of the silver powder having an average particle diameter of not smaller than 1 μm with the ultrafine metal particles having an average particle diameter of at least not larger than 100 nm.

That is, it is concluded that for the ultrafine silver particles contained in the conductive metal pastes of Examples 1-1 and 1-2, a monomolecular layer of an amine compound such as dodecylamine coated on their surfaces and therefore the occurrence of agglomeration caused by fusion of the ultrafine silver particles is suppressed effectively upon application of the paste. In other words, it is evaluated that as at room temperature, the occurrence of agglomeration of the ultrafine silver particles is not observed and no deterioration in printability caused by the occurrence of the agglomeration occurs, its fine printability and uniformity in film thickness is retained, which makes formation of a high density circuit possible.

TABLE 1-1

| | Ultrafine Silver Particles (pts. wt.) | SPN10JF (pts. wt.) | SPQ03S (pts. wt.) | Total Amount of Silver (pts. wt.) | Specific Resistivity ($\Omega \cdot$ cm) | Agglomeration |
|---|---|---|---|---|---|---|
| Example 1-1 | 18 | 73 | 0 | 91 | $8.4 \times 10^{-6}$ | ◯ |
| Example 1-2 | 18 | 0 | 73 | 91 | $6.5 \times 10^{-6}$ | ◯ |

TABLE 1-1-continued

|  | Ultrafine Silver Particles (pts. wt.) | SPN10JF (pts. wt.) | SPQ03S (pts. wt.) | Total Amount of Silver (pts. wt.) | Specific Resistivity ($\Omega \cdot$ cm) | Agglomeration |
|---|---|---|---|---|---|---|
| Comp. Ex. 1-1 | 0 | 91 | 0 | 91 | $1.5 \times 10^{-5}$ | Δ |
| Comp. Ex. 1-2 | 0 | 0 | 91 | 91 | $4.2 \times 10^{-5}$ | Δ |
| Comp. Ex. 1-3 | 0 | 73 | 18 | 91 | $2.2 \times 10^{-5}$ | Δ |

Agglomeration:
X: agglomerated throughout, Δ: partially agglomerated, ○: uniformly dispersed.

As in the specific examples explained above, the low-temperature sintering conductive metal paste for high density circuit printing of the present invention is a conductive metal paste that comprises, as conductive media, metal fillers having an average particle diameter of 0.5 to 20 μm and ultrafine metal particles having an average particle diameter of not larger than 100 nm which are dispersed uniformly in a varnish-like resin composition. As for its composition, the varnish-like resin composition comprises a resin component acting as an organic binder, an acid anhydride or a derivative thereof, and at least one or more organic solvents. Further, the surfaces of the ultrafine metal particles are coated with one amine compound or more having one or more terminal amino groups that are capable of coordinate-bonding to a metal element contained in the ultrafine metal particle, and thus the one or more amine compounds are comprised in an amount of 0.1 to 60 parts by weight, preferable 0.5 to 30 part by weight, more preferably 1 to 10 parts by weight, based on 100 parts by weight of the ultrafine metal particles having an average particle diameter of not larger than 100 nm. The varnish-like resin composition is comprised in an amount of 5 to 100 parts by weight based on 100 parts by weight of a total of the metal fillers and the ultrafine metal particles having the superfine average particle diameter. Thereby, agglomeration and fusion of the ultrafine metal particles are suppressed at the step of applying and printing. Thereafter, when the conductive medium (metal particles) components come into contact with one another along with curing of the resin component so as to achieve electric conduction, the coated paste is heat-treated (baked and cured) at a relatively low temperature not higher than, for example, 300° C. so as to remove said amine compound coating the surfaces of the ultrafine metal particles by also using such a reaction with the organic acid anhydride. At this step, unlike a conventional conductive paste using metal particles having relatively large particle diameters, in addition to the physical contact among the metal fillers, it gives rise also to condensation and fusion of the ultrafine metal particles filling gaps among the metal fillers. The effect of the latter process can mainly serve to form a compact conducting path network of the ultrafine particles, which provides such an advantage that it can achieve excellent electric conductivity in all conducting paths including the metal fillers. Therefore, by use of the ultrafine metal particles, a superfine circuit can be formed, low resistance can be achieved even by low-temperature curing and in addition, high conduction stability which is hard be obtained in conducting paths formed only by contact of simple particles and its reproducibility can be secured, and since the thermally curable resin is comprised, a low-temperature sintering conductive metal paste for high density circuit printing which shows good adhesive force to a substrate is obtained. Furthermore, according to the process for producing a conductive metal paste of the present invention, the low-temperature sintering conductive metal paste for high density circuit printing of the present invention can be prepared easily with high reproducibility by using, for example, as a raw material, ultrafine metal particles with a desired average particle diameter having no oxide film formed on their surfaces and containing an alkylamine or the like as a monomolecular layer to be coated on the surfaces in advance, mixing them with remaining components for resin composition so as to prepare a paste having the ultrafine metal particles dispersed stably and uniformly in the varnish-like resin composition once, further adding metal fillers having larger particle diameters to the paste, and mixing the whole uniformly.

Example 2-1

A commercially available ultrafine silver particle dispersion (product name: individually dispersed ultrafine particles PERFECT SILVER, VACUUM METALLURGICAL CO., LTD.), more specifically, a dispersion of fine silver particles having an average particle diameter of 8 nm which comprised 100 parts by weight of fine silver particles, 15 parts by weight of dodecylamine as an alkylamine and 75 parts by weight of terpineol as an organic solvent was used.

To prepare a conductive metal paste, 6.8 parts by weight of Me-HHPA (methylhexahydrophthalic anhydride) as an acid anhydride and 5 parts by weight of resol phenol resin (product of Gun'ei Chemical Industry Co., Ltd., PL-2211) as a thermosetting resin were added based on 100 parts by weight of the fine silver particles contained in the fine silver particle dispersion. The conductive metal paste prepared by mixing and stirring them was applied on a glass substrate by use of a metal mask to a film thickness of 50 μm and a size of 10 mm in length and 20 mm in width. After its surface condition (occurrence of agglomeration) was checked, the applied paste was allowed to cure at 150° C. for 30 minutes and then 210° C. for 60 minutes. In addition, separately, a thixotropic agent or a diluting solvent (toluene) was added to the conductive metal paste so as to adjust its viscosity to about 80 Pa·s, and pattern with line/space=25/25 μm was printed with a stainless #500 mesh screen plate and allowed to cure under the conditions described above, and its printability was evaluated.

Table 2-1 shows the composition of the conductive metal paste, a surface condition (occurrence of agglomeration) after application of the paste, the specific resistance of the heat-cured product obtained, and the result of evaluation of printability of the conductive metal paste having an adjusted viscosity of 80 Pa·s. The ratio of the amine compound, i.e., dodecylamine, to acid anhydride, i.e., Me-HHPA (methylhexahydrophthalic anhydride) comprised in said conductive metal paste is a ratio of a ½ molecule of the acid anhydride per one amino group.

Example 2-2

By use of a commercially available ultrafine silver particle dispersion (product name: individually dispersed ultrafine particles PERFECT SILVER, VACUUM METALLURGICAL CO., LTD.), a dispersion of fine silver particles having an average particle diameter of 8 nm which comprised 1 part by weight of dodecylamine as an alkylamine and 75 parts by weight of terpineol as an organic solvent based on 100 parts by weight of the contained fine silver particles was prepared.

To prepare a conductive metal paste, 0.45 parts by weight of Me-HHPA (methylhexahydrophthalic anhydride) as an acid anhydride and 5 parts by weight of resol phenol resin (product of Gun'ei Chemical Industry Co., Ltd., PL-2211) as a thermosetting resin were added based on 100 parts by weight of the fine silver particles contained in the fine silver particle dispersion having said composition. The conductive metal paste prepared by mixing and stirring them was applied on a glass substrate by use of a metal mask to a film thickness of 50 μm and a size of 10 mm in length and 20 mm in width. After its surface condition (occurrence of agglomeration) was checked, the applied paste was allowed to cure at 150° C. for 30 minutes and then 210° C. for 60 minutes. In addition, separately, a thixotropic agent or a diluting solvent (toluene) was added to the conductive metal paste so as to adjust its viscosity to about 80 Pa·s, and pattern with line/space=25/25 μm was printed with a stainless #500 mesh screen plate and allowed to cure under the conditions described above, and its printability was evaluated.

Table 2-1 shows the composition of the conductive metal paste, a surface condition (occurrence of agglomeration) after application of the paste, the specific resistance of the heat-cured product obtained, and the result of evaluation of printability of the conductive metal paste having an adjusted viscosity of 80 Pa·s. The ratio of the amine compound, i.e., dodecylamine, to acid anhydride, i.e., Me-HHPA (methylhexahydrophthalic anhydride) comprised in said conductive metal paste is a ratio of a ½ molecule of the acid anhydride per one amino group.

Example 2-3

By use of a commercially available ultrafine silver particle dispersion (product name: individually dispersed ultrafine particles PERFECT SILVER, VACUUM METALLURGICAL CO., LTD.), a dispersion of fine silver particles having an average particle diameter of 8 nm which comprised 0.1 parts by weight of dodecylamine as an alkylamine and 75 parts by weight of terpineol as an organic solvent based on 100 parts by weight of the contained fine silver particles was prepared.

To prepare a conductive metal paste, 0.045 parts by weight of Me-HHPA (methylhexahydrophthalic anhydride) as an acid anhydride and 5 parts by weight of resol phenol resin (product of Gun'ei Chemical Industry Co., Ltd., PL-2211) as a thermosetting resin were added based on 100 parts by weight of the fine silver particles contained in the fine silver particle dispersion having said composition. The conductive metal paste prepared by mixing and stirring them was applied on a glass substrate by use of a metal mask to a film thickness of 50 μm and a size of 10 mm in length and 20 mm in width. After its surface condition (occurrence of agglomeration) was checked, the applied paste was allowed to cure at 150° C. for 30 minutes and then 210° C. for 60 minutes. In addition, separately, a thixotropic agent or a diluting solvent (toluene) was added to the conductive metal paste so as to adjust its viscosity to about 80 Pa·s, and pattern with line/space=25/25 μm was printed with a stainless #500 mesh screen plate and allowed to cure under the conditions described above, and its printability was evaluated.

Table 2-1 shows the composition of the conductive metal paste, a surface condition (occurrence of agglomeration) after application of the paste, the specific resistance of the heat-cured product obtained, and the result of evaluation of printability of the conductive metal paste having an adjusted viscosity of 80 Pa·s. The ratio of the amine compound, i.e., dodecylamine, to acid anhydride, i.e., Me-HHPA (methylhexahydrophthalic anhydride) contained in said conductive metal paste is a ratio of a ½ molecule of the acid anhydride per one amino group.

Comparative Example 2-1

By use of a commercially available ultrafine silver particle dispersion (product name: individually dispersed ultrafine particles PERFECT SILVER, VACUUM METALLURGICAL CO., LTD.), a dispersion of fine silver particles having an average particle diameter of 8 nm which comprised 0.05 parts by weight of dodecylamine as an alkylamine and 75 parts by weight of terpineol as an organic solvent based on 100 parts by weight of the contained fine silver particles was prepared.

To prepare a conductive metal paste, 0.0225 parts by weight of Me-HHPA (methylhexahydrophthalic anhydride) as an acid anhydride and 5 parts by weight of resol phenol resin (product of Gun'ei Chemical Industry Co., Ltd., PL-2211) as a thermosetting resin were added based on 100 parts by weight of the fine silver particles contained in the fine silver particle dispersion having said composition. The conductive metal paste prepared by mixing and stirring them was applied on a glass substrate by use of a metal mask to a film thickness of 50 μm and a size of 10 mm in length and 20 mm in width. After its surface condition (occurrence of agglomeration) was checked, the applied paste was allowed to cure at 150° C. for 30 minutes and then 210° C. for 60 minutes. In addition, separately, a thixotropic agent or a diluting solvent (toluene) was added to the conductive metal paste so as to adjust its viscosity to about 80 Pa·s, and pattern with line/space=25/25 μm was printed with a stainless #500 mesh screen plate and allowed to cure under the conditions described above, and its printability was evaluated.

Table 2-1 shows the composition of the conductive metal paste, a surface condition (occurrence of agglomeration) after application of the paste, the specific resistance of the heat-cured product obtained, and the result of evaluation of printability of the conductive metal paste having an adjusted viscosity of 80 Pa·s. The ratio of the amine compound, i.e., dodecylamine, to acid anhydride, i.e., Me-HHPA (methylhexahydrophthalic anhydride) contained in said conductive metal paste is a ratio of a ½ molecule of the acid anhydride per one amino group. The amount of the amine compound, i.e., dodecylamine, is only a half of an amount required to coat the surfaces of the fine silver particles with a monomolecular layer of dodecylamine.

Comparative Example 2-2

By use of a commercially available ultrafine silver particle dispersion (product name: individually dispersed ultrafine particles PERFECT SILVER, VACUUM METALLURGICAL CO., LTD.), an alkylamine coating the contained fine silver particles, i.e., dodecylamine, was removed once, and then a dispersion of fine silver particles having an average particle diameter of 8 nm and having no dodecylamine coating layer, the dispersion also comprising 75 parts by weight of terpineol as an organic solvent, was prepared.

To prepare a conductive metal paste, Me-HHPA (methylhexahydrophthalic anhydride) as an acid anhydride was not added, and only 5 parts by weight of resol phenol resin (product of Gunei Chemical Industry Co., Ltd., PL-2211) as a thermosetting resin was added based on 100 parts by weight of the fine silver particles contained in the fine silver particle dispersion having said composition. The conductive metal paste prepared by mixing and stirring them was applied on a glass substrate by use of a metal mask to a film thickness of 50 μm and a size of 10 mm in length and 20 mm in width. After its surface condition (occurrence of agglomeration) was checked, the applied paste was allowed to cure at 150° C. for 30 minutes and then 210° C. for 60 minutes. In addition, separately, a thixotropic agent or a diluting solvent (toluene) was added to the conductive metal paste so as to adjust its viscosity to about 80 Pa·s, and pattern with line/space=25/25 μm was printed with a stainless #500 mesh screen plate and allowed to cure under the conditions described above, and its printability was evaluated.

Table 2-1 shows the composition of the conductive metal paste, a surface condition (occurrence of agglomeration) after application of the paste, the specific resistance of the heat-cured product obtained, and the result of evaluation of printability of the conductive metal paste having an adjusted viscosity of 80 Pa·s.

Example 2-4

By use of a commercially available ultrafine silver particle dispersion (product name: individually dispersed ultrafine particles PERFECT SILVER, VACUUM METALLURGICAL CO., LTD.), a dispersion of fine silver particles having an average particle diameter of 8 nm which comprised 10 parts by weight of dodecylamine as an alkylamine and 75 parts by weight of terpineol as an organic solvent based on 100 parts by weight of the contained fine silver particles was prepared.

To the dispersion of the fine silver particles, 5 parts by weight of polyoxyalkyleneamine (average molecular weight: about 440) composed essentially of a component represented by the following formula (I):

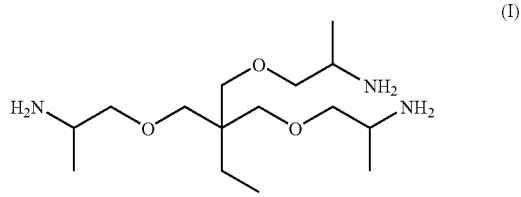

(I)

was added based on 100 parts by weight of the fine silver particles, and they were stirred and mixed to obtain a uniform mixture. Through this treatment, the dispersion comprising the fine silver particles where a portion of dodecylamine coating the surfaces thereof was replaced by the polyoxyalkyleneamine was prepared.

More specifically, 50 parts by weight (corresponding to twice as much as the molar amount of dodecylamine) of the polyoxyalkyleneamine (average molecular weight: about 440) was added based on 100 parts by weight of the fine silver particles, and the mixture was stirred for 30 minutes or longer. After stirring, about 100 parts by weight of acetone was added per part by weight of the fine silver particles so as to wash out an excessive polyoxyalkyleneamine and dodecylamine released by the replacement, thereby dissolving the excessive polyoxyalkyleneamine and dodecylamine set free in the solvent. Thereafter, solid-liquid separation of the fine silver particles and the acetone solution was carried out by centrifugation to remove the acetone solution. Again, 75 parts by weight of terpineol was added as a dispersion medium based on 100 parts by weight of the fine silver particles so as to obtain a uniform dispersion. Acetone remaining in a slight amount was selectively distilled off by vacuum distillation (temperature: 30° C., pressure: 533 Pa) after the addition of terpineol. When the amounts of dodecylamine and polyoxyalkyleneamine comprised in the dispersion obtained by the aforementioned treatment were analyzed by gas chromatography, it is found that obtained was the dispersion of the fine silver particles where the surfaces thereof retained only 10 parts by weight of dodecylamine, but has instead 5 parts by weight of the polyoxyalkyleneamine for coating partially thereon, based on 100 parts by weight of the fine silver particles.

To prepare a conductive metal paste, 4.9 parts by weight of Me-HHPA (methylhexahydrophthalic anhydride) as an acid anhydride and 5 parts by weight of resol phenol resin (product of Gun'ei Chemical Industry Co., Ltd., PL-2211) as a thermosetting resin were added based on 100 parts by weight of the fine silver particles contained in the thus treated fine silver particle dispersion. The conductive metal paste prepared by mixing and stirring them was applied on a glass substrate by use of a metal mask to a film thickness of 50 μm and a size of 10 mm in length and 20 mm in width. After its surface condition (occurrence of agglomeration) was checked, the applied paste was allowed to cure at 150° C. for 30 minutes and then 210° C. for 60 minutes. The specific resistance of the obtained heat-cured product was measured. In addition, separately, a thixotropic agent or a diluting solvent (toluene) was added to the conductive metal paste so as to adjust its viscosity to about 80 Pa·s, and pattern with line/space=25/25 μm was printed with a stainless #500 mesh screen plate and allowed to cure under the conditions described above, and its printability was evaluated.

Table 2-1 shows the composition of the conductive metal paste, a surface condition (occurrence of agglomeration) after application of the paste, the specific resistance of the heat-cured product obtained, and the result of evaluation of printability of the conductive metal paste having an adjusted viscosity of 80 Pa·s. The ratio of the amine compound, i.e., dodecylamine, to acid anhydride, i.e., Me-HHPA (methylhexahydrophthalic anhydride) contained in said conductive metal paste is a ratio of a ½ molecule of the acid anhydride per one amino group.

Example 2-5

With reference to a method using ethanolamine as a reducing agent (Japanese Patent Application Laid-Open No. 319538/1999), a dispersion of ultrafine silver particles, more specifically, a dispersion of fine silver particles having an average particle diameter of 8 nm which comprised 100 parts by weight of the fine silver particles, 10 parts by weight of ethanolamine as an amine compound, and 75 parts by weight of terpineol as an organic solvent was prepared.

To prepare a conductive metal paste, 13.8 parts by weight of Me-HHPA (methylhexahydrophthalic anhydride) as an acid anhydride and 5 parts by weight of resol phenol resin (product of Gun'ei Chemical Industry Co., Ltd., PL-2211) as a thermosetting resin were added based on 100 parts by weight of the fine silver particles contained in said fine silver particle dispersion. The conductive metal paste prepared by mixing and stirring them was applied on a glass substrate by use of a metal mask to a film thickness of 50 μm and a size of 10 mm in length and 20 mm in width. After its surface condition (occurrence of agglomeration) was checked, the applied paste was allowed to cure at 150° C. for 30 minutes and then 210° C. for 60 minutes. In addition, separately, a thixotropic agent or a diluting solvent (toluene) was added to the conductive metal paste so as to adjust its viscosity to about 80 Pa·s, and pattern with line/space=25/25 μm was printed with a stainless #500 mesh screen plate and allowed to cure under the conditions described above, and its printability was evaluated.

Table 2-1 shows the composition of the conductive metal paste, a surface condition (occurrence of agglomeration) after application of the paste, the specific resistance of the heat-cured product obtained, and the result of evaluation of printability of the conductive metal paste having an adjusted viscosity of 80 Pa·s. The ratio of the amine compound, i.e., ethanolamine, to acid anhydride, i.e., Me-HHPA (methylhexahydrophthalic anhydride) contained in said conductive metal paste is a ratio of a ½ molecule of the acid anhydride per one amino group.

Table 2-1 summarizes the results of Examples 2-1 to 2-5 and Comparative Examples 2-1 and 2-2. Comparative studying the results shown in Table 2-1, it is understood from the results of Examples 2-1 and 2-3 and Comparative Examples 2-1 and 2-2 that as the content of dodecylamine based on 100 parts by weight of the fine silver particles decreases, the specific resistance of the cured product obtained by heat-curing the conductive metal paste gradually increases. Further, as the content of dodecylamine becomes lower than 0.1 parts by weight based on 100 parts by weight of the fine silver particles and falls short of an amount to form a monomolecular layer of dodecylamine covering the surfaces of the fine silver particles, a sharp increase in the specific resistance is seen. Along with that, the occurrence of agglomeration of the fine silver particles in the applied paste is observed even at room temperature. In addition, the printability is also clearly degraded due to the occurrence of the agglomeration.

It is determined from the above comparisons that in Examples 2-1 to 2-3 and Comparative Example 2-1 which have the dodecylamine layer coating the surfaces of the fine silver particles other than Comparative Example 2-2 having no coating layer of an amine compound, as the content of dodecylamine based on 100 parts by weight of the fine silver particles decreases and the uniform coating layers are liable to be injured, some agglomerations of the fine silver particles comprised therein occur even at room temperature, and its printability is influenced by them and degraded.

Further, as a result of further detailed studies, while only a slight decrease in specific resistance is observed when the content of dodecylamine is not lower than 3 parts by weight based on 100 parts by weight of the fine silver particles, the decrease in specific resistance becomes significant when the content of dodecylamine becomes lower than 3 parts by weight, and a sharp increase in specific resistance is seen once the content of dodecylamine decreases down to the critical level as low as 0.1 parts by weight. It is assumed that this is caused by a combination of two phenomena following; the effect of suppressing oxidation of the surfaces by the presence of the coating layers comprising the amine compound is gradually weakened, and although such agglomerations of macroscopic scale that can be recognized by observation are not formed, partial agglomerations of microscopic scale gradually proceed, so that the formation of a compact conductive layer network by a heat treatment is gradually inhibited.

Further, under the condition where the ratio of the acid anhydride, i.e., Me-HHPA (methylhexahydrophthalic anhydride) to the amine compound coating the surfaces of the fine silver particles holds to be a ratio of a ½ molecule of the acid anhydride per one amino group, as long as the content of the amine compound is set in a range of significantly larger than 3 parts by weight based on 100 parts by weight of fine silver particles, dependence (difference) on the type of the amine compound used is not so large. More specifically, when the results of Examples 2-1, 2-4 and 2-5 are compared with one another, all of them have good results with respect to the surface condition (occurrence of agglomeration) after application of the paste, the specific resistance of the obtained heat-cured product, and the evaluation of printability of the conductive metal paste having an adjusted viscosity of 80 Pa·s. Further, when Example 2-1 is more specifically compared with Example 2-4, the results of Example 2-4 are concluded to be more preferable than those of Example 2-1 although the total of amino groups in the amine compound is slightly smaller in the case of Example 2-4. Therefore, it is evaluated that when a portion of the alkylamine is replaced by a polyoxyalkyleneamine having more sites with high polarity, an improvement in the surface condition (occurrence of agglomeration) after application of the paste is achieved, and a further improvement in the specific resistance of the obtained heat-cured product is also achieved as a result of said suppressed agglomeration.

TABLE 2-1

|  | Dodecyl-amine | Polyoxy-alkyleneamine | Ethanol-amine | Me-HHPA | Specific Resistance ($1 \times 10^{-5}$ Ω·cm) | Agglomeration/ Printability |
|---|---|---|---|---|---|---|
| Example 2-1 | 15 | 0 | 0 | 6.8 | 4.5 | ○/○ |
| Example 2-2 | 1 | 0 | 0 | 0.45 | 6.0 | ○/○ |
| Example 2-3 | 0.1 | 0 | 0 | 0.045 | 10.0 | ○/○ |
| Comp. Ex. 2-1 | 0.05 | 0 | 0 | 0.0225 | 130 | Δ/Δ |
| Comp. Ex. 2-2 | 0 | 0 | 0 | 0 | 250 | X/XX |
| Example 2-4 | 10 | 5 | 0 | 4.9 | 4.0 | ◎/○ |
| Example 2-5 | 0 | 0 | 10 | 13.8 | 4.5 | ○/○ |

Agglomeration;
X: agglomerated throughout, Δ: partially agglomerated, ○: uniformly dispersed in appearance, ◎: uniformly dispersed
Printability:
XX: A pattern could not be printed by using screen mask.
X: A printed pattern had a partial lack therein.
Δ: A pattern could be printed, but its edges were waved to 3 to 4 μm.
○: A pattern with good linearity could be printed.

Reference Examples 2-1 to 2-4

As in the case of Example 2-1, a commercially available ultrafine silver particle dispersion (product name: individually dispersed ultrafine particles PERFECT SILVER, VACUUM METALLURGICAL CO., LTD.), more specifically, a dispersion of fine silver particles having an average particle diameter of 8 nm which comprised 100 parts by weight of the fine silver particles, 15 parts by weight of dodecylamine as an alkylamine and 75 parts by weight of terpineol as an organic solvent was used.

To prepare conductive metal pastes, Me-HHPA (methylhexahydrophthalic anhydride) as an acid anhydride was added in amounts listed in Table 2-2 and 5 parts by weight of resol phenol resin (product of Gun'ei Chemical Industry Co., Ltd., PL-2211) as a thermosetting resin was also added based on 100 parts by weight of the fine silver particles contained in the fine silver particle dispersion. The influences of addition of the various amounts of methylhexahydrophthalic anhydride as an acid anhydride on the properties of the obtained conductive metal pastes were examined.

As in the case of Example 2-1, each of the prepared conductive metal pastes was applied on a glass substrate by use of a metal mask to a film thickness of 50 μm and a size of 10 mm in length and 20 mm in width. After its surface condition (occurrence of agglomeration) was checked, the applied paste was allowed to cure at 150° C. for 30 minutes and then 210° C. for 60 minutes. The specific resistance of the obtained heat-cured product was measured. In addition, separately, a thixotropic agent or a diluting solvent (toluene) was added to the conductive metal pastes so as to adjust its viscosity to about 80 Pa·s, and pattern with line/space=25/25 μm was printed with a stainless #500 mesh screen plate and allowed to cure under the conditions described above, and its printability was evaluated.

Table 2-2 shows the compositions of the conductive metal pastes of Example 2-1 and Reference Examples 2-1 to 2-4, surface conditions (occurrence of agglomeration) after application of the pastes, and the results of evaluation of the specific resistances of the obtained heat-cured products. The results of evaluation for the printability of each of the conductive metal pastes having an adjusted viscosity of 80 Pa·s of Example 2-1 and Reference Examples 2-1 to 2-4 were all good and omitted from Table 2-2. As shown in Table 2-2, when the amount of Me-HHPA added as an acid anhydride is not sufficient based on the total amount of amino groups in dodecylamine, more specifically, when the content of dodecylamine is 15 parts by weight and the content of Me-HHPA is 2 parts by weight or lower based on 100 parts by weight of the fine silver particles, the specific resistance of the obtained heat-cured product is significantly high, and the influence of the content of Me-HHPA on electric properties is shown as the increase in the specific resistance. Particularly, in Reference Example 2-1 comprising no acid anhydride, the specific resistance of the obtained heat-cured product is remarkably high. It is concluded from the results of comparisons that the amine compound coating the surfaces of the fine silver particles fulfils its function in preventing agglomeration of the fine silver particles and retaining uniform dispersion of the fine silver particles in the conductive metal paste stored, and the speed of its thermal dissociation for its self-detachment that is initiated by thermal excitation when the compound is heat-treated is not satisfactory, but its smooth release can be attained by its accelerated reaction with the organic acid anhydride. As a result of forming an amide bond by the reaction with the organic acid anhydride or a similar reaction with an organic acid, the amine compound coating the surfaces of the fine silver particles is removed only when heated, the surfaces of the fine silver particles can contact with one another, and subsequent fusion of the particles proceed more quickly.

Further, when the content of Me-HHPA reaches 10 parts by weight, a significant increase in specific resistance is observed, and when the content of Me-HHPA exceeds 10 parts by weight and increases to 20 parts by weight, a more distinct increase in specific resistance occurs. Furthermore, when the content of Me-HHPA goes to such excess as of 20 parts by weight, agglomeration and deterioration of printability occur. Evaluating these results comprehensively, it is understood that it is more preferred that the amount (moles) of the acid anhydride to be added is chosen to be a half or some more based on the total amount (moles) of amino groups present in the alkylamines. However, it is also understood that it is desirable to avoid adding an unnecessarily large amount of the acid anhydride, for example, the amount (moles) of the acid anhydride to be added is more preferably kept equal to or smaller than the total amount of the amino groups.

TABLE 2-2

| | Alkylamine | Me-HHPA | Specific Resistance ($1 \times 10^{-5}$ Ω · cm) | Agglomeration |
|---|---|---|---|---|
| Example 2-1 | 15 | 6.8 | 4.5 | ◯ |
| Reference Ex. 2-1 | 15 | 0 | 122 | ◯ |
| Reference Ex. 2-2 | 15 | 2 | 12 | ◯ |
| Reference Ex. 2-3 | 15 | 10 | 8.0 | ◯ |
| Reference Ex. 2-4 | 15 | 20 | 14 | Δ |

Agglomeration:
X: agglomerated throughout,
Δ: partially agglomerated,
◯: uniformly dispersed.

Example 2-6

By use of a commercially available ultrafine silver particle dispersion (product name: individually dispersed ultrafine particles PERFECT SILVER, VACUUM METALLURGICAL CO., LTD.), a dispersion of fine silver particles having an average particle diameter of 8 nm which comprised 1.1 parts by weight of dodecanethiol (molecular weight: 202.40, boiling point: 266 to 283° C.) as an alkylthiol and 75 parts by weight of terpineol as an organic solvent based on 100 parts by weight of the contained fine silver particles was prepared.

More specifically, 22 parts by weight of dodecanethiol as an alkanethiol was added to said ultrafine silver particle dispersion based on 100 parts by weight of the contained fine silver particles, and the mixture was stirred for 30 minutes or longer. After stirring, about 100 parts by weight of acetone was added per part by weight of the fine silver particles so as to wash out excessive dodecanethiol and dodecylamine released by replacement, thereby dissolving the excessive dodecanethiol and dodecylamine set free in the solvent. Thereafter, solid-liquid separation of the fine silver particles and the acetone solution was carried out by centrifugation so as to remove the acetone solution. Again, 75 parts by weight of terpineol was added as a dispersion medium based on 100 parts by weight of the fine silver particles so as to obtain a uniform dispersion. Acetone remaining in a slight amount was selectively distilled off by vacuum distillation (temperature: 30° C., pressure: 533 Pa) after the addition of terpineol. When the amounts of dodecylamine and dodecanethiol comprised in the dispersion obtained by the treatment mentioned above were analyzed by gas chromatography, it is found that obtained was the dispersion of the fine silver particles where the surfaces thereof retained only 0.1 or less parts by weight of dodecylamine, but has instead 1.1 parts by weight of dodecanethiol for coating thereon, based on 100 parts by weight of the fine silver particles.

To prepare a conductive metal paste, 0.45 parts by weight of Me-HHPA as an acid anhydride and 5 parts by weight of resol phenol resin (product of Gun'ei Chemical Industry Co., Ltd., PL-2211) as a thermosetting resin were added based on 100 parts by weight of the fine silver particles contained in the fine silver particle dispersion having said composition. The conductive metal paste prepared by mixing and stirring them was applied on a glass substrate by use of a metal mask to a film thickness of 50 μm and a size of 10 mm in length and 20 mm in width. After its surface condition (occurrence of agglomeration) was checked, the applied paste was allowed to cure at 220° C. for 60 minutes. In addition, separately, a thixotropic agent or a diluting solvent (toluene) was added to the conductive metal paste so as to adjust its viscosity to about 80 Pa·s, and pattern with line/space=25/25 μm was printed with a stainless #500 mesh screen plate and allowed to cure under the conditions described above, and it sprintability was evaluated.

Table 2-3 shows the composition of the conductive metal paste, a surface condition (occurrence of agglomeration) after application of the paste, the specific resistance of the heat-cured product obtained, and the result of evaluation of printability of the conductive metal paste having an adjusted viscosity of 80 Pa·s. The ratio of the sulfur-containing compound, i.e., dodecanethiol, to acid anhydride, i.e., Me-HHPA contained in said conductive metal paste is a ratio of a ½ molecule of the acid anhydride per one sulfanyl group.

Example 2-7

By use of a commercially available ultrafine silver particle dispersion (product name: individually dispersed ultrafine particles PERFECT SILVER, VACUUM METAL-LURGICAL CO., LTD.), a dispersion of fine silver particles having an average particle diameter of 8 nm which comprised 0.54 parts by weight of liquid polyethylene glycol #200 (average molecular weight: 190 to 210, measured molecular weight: 200) represented by the following formula (II):

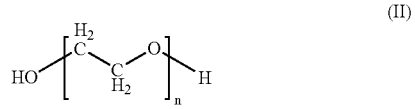

(II)

as diols (glycols) and 75 parts by weight of terpineol as an organic solvent based on 100 parts by weight of the contained fine silver particles was prepared.

More specifically, 20 parts by weight of said liquid polyethylene glycol #200 as an oxygen-based ligand was added to said ultrafine silver particle dispersion based on 100 parts by weight of the contained fine silver particles, and the mixture was stirred for 30 minutes or longer. After stirring, about 100 parts by weight of toluene was added per part by weight of the fine silver particles so as to wash out excessive polyethylene glycol and dodecylamine released by replacement, thereby dissolving the excessive polyethylene glycol and dodecylamine set free in the solvent. Thereafter, solid-liquid separation of the fine silver particles and the toluene solution was carried out by centrifugation so as to remove the toluene solution. Again, 75 parts by weight of terpineol was added as a dispersion medium based on 100 parts by weight of the fine silver particles so as to obtain a uniform dispersion. Toluene remaining in a slight amount was selectively distilled off by vacuum distillation (temperature: 55° C., pressure: 533 Pa) after the addition of terpineol. When the amounts of dodecylamine and polyethylene glycol comprised in the dispersion obtained by the treatment mentioned above were analyzed by gas chromatography, it is found that obtained was the dispersion of the fine silver particles where the surfaces thereof retained only 0.1 or less parts by weight of dodecylamine, but has instead 0.54 parts by weight of the polyethylene glycols for coating thereon, based on 100 parts by weight of the fine silver particles.

To prepare a conductive metal paste, 0.45 parts by weight of Me-HHPA as an acid anhydride and 5 parts by weight of resol phenol resin (product of Gun'ei Chemical Industry Co., Ltd., PL-2211) as a thermosetting resin were added based on 100 parts by weight of the fine silver particles contained in the fine silver particle dispersion having said composition. The conductive metal paste prepared by mixing and stirring them was applied on a glass substrate by use of a metal mask to a film thickness of 50 μm and a size of 10 mm in length and 20 mm in width. After its surface condition (occurrence of agglomeration) was checked, the applied paste was allowed to cure at 220° C. for 60 minutes. In addition, separately, a thixotropic agent or a diluting solvent (toluene) was added to the conductive metal paste so as to adjust its viscosity to about 80 Pa·s, and pattern with line/space=25/25 μm was printed with a stainless #500 mesh screen plate and allowed to cure under the conditions described above, and its printability was evaluated.

Table 2-3 shows the composition of the conductive metal paste, a surface condition (occurrence of agglomeration) after application of the paste, the specific resistance of the heat-cured product obtained, and the result of evaluation of printability of the conductive metal paste having an adjusted viscosity of 80 Pa·s. The ratio of the oxygen-containing compound, i.e., polyethylene glycol, to acid anhydride, i.e., Me-HHPA contained in said conductive metal paste is a ratio of a ½ molecule of the acid anhydride per one hydroxyl group.

TABLE 2-3

|  | Dodecane-thiol | Polyethylene Glycols | Me-HHPA | Specific Resistance ($1 \times 10^{-5}$ Ω·cm) | Agglomeration/ Printability |
| --- | --- | --- | --- | --- | --- |
| Example 2-6 | 1.1 | 0 | 0.45 | 3.0 | ○/○ |
| Example 2-7 | 0 | 0.54 | 0.45 | 3.5 | ○/○ |

Agglomeration:
X: agglomerated throughout, Δ: partially agglomerated, 0: uniformly dispersed
Printability:
XX: A pattern could not be printed by using screen mask.
X: A printed pattern had a partial lack therein.
Δ: A pattern could be printed, but its edges were waved to 3 to 4 μm.
○: A pattern with good linearity could be printed.

The low-temperature sintering conductive metal paste for superfine circuit printing of the present invention is a conductive metal paste that comprises, as conductive media, ultrafine metal particles having an average particle diameter of not larger than 100 nm which are dispersed uniformly in a varnish-like resin composition. As for its composition, the vanish-like resin composition comprises a resin component acting as an organic binder, an acid anhydride or a derivative thereof, and at least one or more organic solvents. Further, the surfaces of the ultrafine metal particles are coated with one amine compound or more having one or more terminal amino groups that are capable of coordinate-bonding to a metal element contained in the ultrafine metal particle, and thus the one or more amine compounds are comprised in an amount of 0.1 to 60 parts by weight, preferably 0.5 to 30 parts by weight, more preferably 1 to 10 parts by weight, for instance, an alkylamine is comprised in an amount of 0.1 to 15 parts by weight and a polyoxyalkyleneamine is also comprised in an amount of 5 to 8 parts by weight, based on 100 parts by weight of the ultrafine metal particles having an average particle diameter of not larger than 100 nm. Thereby, agglomeration and fusion of the ultrafine metal particles in such compositions are suppressed at the step of applying and printing. Thereafter, when the coated paste is heat-treated (baked) at a relatively low temperature not higher than, for example, 300° C. so as to remove said amine compound coating the surfaces of the ultrafine metal particles by also using such a reaction with the organic acid anhydride, unlike a conventional conductive paste using metal particles having relatively large particle diameters, of which electric conduction is achieved by contact of the conductive medium (metal particles) components with one another associated to curing of the resin component, in addition to the physical contact therein, it gives rise also to condensation and fusion of the ultrafine metal particles. The effect of the latter process can mainly serve to form a compact conducting path network of the ultrafine particles, which provides such an advantage that it can achieve desirable electric conductivity there through.

Therefore, by use of the ultrafine metal particles, a superfine circuit can be formed, low resistance can be achieved even by low-temperature curing and in addition, high conduction stability which is hard be obtained in conducting paths formed only by contact of simple particles and its reproducibility can be secured, and since the thermally curable resin is comprised, a low-temperature sintering conductive metal paste for superfine circuit printing which shows good adhesive force to a substrate is obtained.

Furthermore, according to the process for producing a conductive metal paste of the present invention, the low-temperature sintering conductive metal paste for superfine circuit printing of the present invention can be prepared easily with high reproducibility by using, for example, as a raw material, ultrafine metal particles with a desired average particle diameter having no oxide film formed on their surfaces and containing an alkylamine or the like as a monomolecular layer to be coated on the surfaces in advance, preferably being set in the state where portions of their surfaces are coated with polyoxyalkyleneamines by applying the polyoxyalkyleneamines to the ultrafine metal particles in advance, and then mixing them with remaining components for resin composition.

INDUSTRIAL APPLICABILITY

In the conductive metal paste of the present invention, as for conductive media, in addition to metal fillers having an average particle diameter of 0.5 to 20 μm, ultrafine metal particles having an average particle diameter of not larger than 100 nm is used, which are set in the state where their surfaces are coated with one compound or more which has a group containing a nitrogen, oxygen or sulfur atom and capable of coordinate-bonding by lone pairs existing in these atoms as a group capable of coordinate-bonding to a metal element contained in the ultrafine metal particle, for example, with one amine compound or more having one or more terminal amino groups. The ultrafine metal particles are dispersed uniformly in a resin composition which comprises a heat curable resin component, a compound component having reactivity with the group containing the nitrogen, oxygen or sulfur atom when heated, for example, an organic acid anhydride or a derivative thereof or an organic acid, and one or more organic solvents. While the paste is stored around room temperature, agglomeration of the ultrafine metal particles therein is prevented by coating layers composed of the compound containing a nitrogen, oxygen or a sulfur atom. Meanwhile, when the paste is to be heat-cured at a low temperature after applied, the coating layers composed of the compound containing a nitrogen, oxygen or sulfur atom are removed by a reaction with the compound component having reactivity with the group containing the nitrogen, oxygen or sulfur atom, for instance, an organic acid anhydride or a derivative thereof or an organic acid, thereby making low-temperature sintering of the ultrafine metal particles possible. As a result, the conductive metal paste of the present invention is used as a low-temperature sintering conductive metal paste for high density circuit printing which exhibits fine pattern printability ascribable to use of the ultrafine metal particles, has good adhesive force when applied on a substrate and baked, and can form a fine circuit with a smooth surface and low resistance.

The invention claimed is:

1. A conductive metal paste wherein:
the conductive metal paste comprises an organic binder resin composition, ultrafine metal particles having a very small average particle diameter and metal fillers, that are both dispersed uniformly in the composition,
an average particle diameter for said metal fillers is selected from a range of 0.5 to 20 μm,
an average particle diameter for said ultrafine metal particles with a very small average particle diameter is chosen from a range of 1 to 100 nm,
the surfaces of the ultrafine metal particles are coated with one coating compound or more which has a group containing a nitrogen, oxygen or sulfur atom and capable of coordinate-bonding by a lone pairs existing in the atoms as a group capable of coordinate-bonding to a metal element contained in the ultrafine metal particle,
said one or more coating compounds having the group containing the nitrogen, oxygen or sulfur atom are contained in a total amount of 0.1 to 60 parts by weight based on 100 parts by weight of said ultrafine metal particles,
said organic binder resin composition comprises a resin component acting as an organic binder, a reactive component having reactivity with the group containing the nitrogen, oxygen or sulfur atom of said coating compound when heated therewith, and at least one or more organic solvents, and
said organic binder resin composition is contained in an amount of 5 to 100 parts by weight based on 100 parts by weight of a total of the metal fillers and the ultrafine metal particles having a very small average particle diameter, wherein said coating compound which has the group containing the nitrogen, oxygen or sulfur as a group capable of coordinate-bonding by the lone pair is selected from amine compounds having one or more terminal amino groups, thiol compounds having one or more sulfanyl groups (—SH) or glycols having two hydroxyl groups, and one or more organic acid anhydrides or derivative(s) thereof are selected as said reactive component having reactivity with the group containing the nitrogen, oxygen or sulfur atom.

2. A conductive metal paste claimed in claim 1, wherein an organic acid anhydride is selected as the reactive component having reactivity with the group containing the nitrogen, oxygen or sulfur atom in the coating compound having the group, when heated with said coating compound having the group containing the nitrogen, oxygen or sulfur atom.

3. A conductive metal paste claimed in claim 2, wherein the ultrafine metal particles having a very small average particle diameter are ultrafine metal particles formed at least from one or more metal out of silver, gold, copper, platinum, palladium, rhodium, ruthenium, iridium, osmium, tungsten, nickel, tantalum, bismuth, lead, indium, tin, zinc, and titanium.

4. A conductive metal paste claimed in claim 2, wherein the average particle diameter for the ultrafine metal particles with a very small average particle diameter is chosen from a range of 2 to 10 nm.

5. A conductive metal paste claimed in claim 2, wherein the resin component acting as an organic binder and comprised in the organic binder resin component is selected from thermosetting resins.

6. A conductive metal paste claimed in claim 2, wherein one amine compound or more having one or more terminal amino groups is selected as said coating compound having the group containing the nitrogen, oxygen or sulfur atom.

7. A conductive metal paste claimed in claim 6, wherein the one amine compound or more having one or more terminal amino groups includes an alkylamine.

8. A conductive metal paste claimed in claim 2, wherein a content ratio of said metal fillers to the ultrafine metal particles with a very small average particle diameter is selected from a range of 0.1 to 1,000 parts by weight of the metal fillers, based on 10 parts by weight of said ultrafine metal particles having a very small average particle diameter.

9. A conductive metal paste claimed in claim 1, wherein the reactive component having reactivity with the group containing the nitrogen, oxygen or sulfur atom in the coating compound having the group, when heated with said coating compound having the group containing the nitrogen, oxygen or sulfur atom is a cyclic acid anhydride that is derived from an aliphatic organic dibasic acid, or a derivative thereof.

10. A process for producing a conductive metal paste comprising the step of preparing a conductive metal paste in which ultrafine metal particles with a very small average particle diameter and metal fillers are dispersed uniformly in a organic binder resin composition, wherein:

an average particle diameter for said ultrafine metal particles with a very small average particle diameter is selected from a range of 1 to 100 nm, a dispersion obtained by dispersing the ultrafine metal particles in one or more organic solvents is used, where the surfaces of the ultrafine metal particles are set in the state of being coated with one coating compound or more which has a group containing a nitrogen, oxygen or sulfur atom and capable of coordinate-bonding by alone pairs existing in these atoms as a group capable of coordinate-bonding to a metal element contained in the ultrafine metal particle, wherein said dispersion of the ultrafine metal particles is prepared into such a composition as that said one coating compound or more having the group containing the nitrogen, oxygen or sulfur atom are contained in a total amount of 0.1 to 60 parts by weight, at need, based on 100 parts by weight of said ultrafine metal particles, with said dispersion of the ultrafine metal particles, a resin component acting as an organic binder, a reactive component having reactivity with the group containing the nitrogen, oxygen or sulfur atom when heated with said coating compound having the group containing the nitrogen, oxygen or sulfur atom, and an organic solvent as required, which are comprised in said composition, are mixed and stirred so as to prepare the organic binder resin composition, and thereby a paste mixture comprising said ultrafine metal particles being uniformly dispersed therein are obtained, the metal fillers of which an average particle diameter is selected from a range of 0.5 to 20 μm are further added to said paste mixture, which is then uniformly mixed into a paste, and the paste is formulated such that content ratio of said organic binder resin composition therein is set in an amount of 5 to 100 parts by weight based on 100 parts by weight of a total of the metal fillers and the ultrafine metal particles having a very small average particle diameter, wherein said coating compound which has the group containing the nitrogen, oxygen or sulfur as a group capable of coordinate-bonding by the lone pair is selected from amine compounds having one or more terminal amino groups, thiol compounds having one or more sulfanyl groups (—SH) or glycols having two hydroxyl groups, and one or more organic acid anhydrides or derivative(s) thereof are selected as said reactive component having reactivity with the group containing the nitrogen, oxygen or sulfur atom.

11. A process for producing a conductive metal paste claimed in claim 10, wherein an organic acid anhydride or is selected for as the reactive component having reactivity with the group containing the nitrogen, oxygen or sulfur atom, when heated with said coating compound which has the group containing the nitrogen, oxygen or sulfur atom.

12. A conductive metal paste wherein:

the conductive metal paste comprises a organic binder resin composition and ultrafine metal particles having a very small average particle diameter, that are dispersed uniformly in the composition, the average particle diameter for said ultrafine metal particles with a very small average particle diameter is selected from a range of 1 to 100 nm, the surfaces of said ultrafine metal particles are coated with one coating compound or more which has a group containing a nitrogen, oxygen or sulfur atom and capable of coordinate-bonding by a lone pairs existing in these atoms as a group capable of coordinate-bonding to a metal element contained in the ultrafine metal particle, said organic binder resin composition comprises a resin component acting as an organic binder, a reactive component having reactivity with the group containing the nitrogen, oxygen or sulfur atom of said coating compound when heated, and at least one or more organic solvents, and said one coating compound or more having the group containing the nitrogen, oxygen or sulfur atom are contained in a total amount of 0.1 to 60 parts by weight based on 100 parts by weight of said ultrafine metal particles, wherein said coating compound which has the group containing the nitrogen, oxygen or sulfur as a group capable of coordinate-bonding by the lone pair is selected from amine compounds having one or more terminal amino groups, thiol compounds having one or more sulfanyl groups (—SH) or glycols having two hydroxyl groups, and one or more organic acid anhydrides or derivative(s) thereof are selected as said reactive component having reactivity with the group containing the nitrogen, oxygen or sulfur atom.

13. A conductive metal paste claimed in claim 12, wherein an organic acid anhydride or a derivative thereof is selected as the reactive component having reactivity with the group containing the nitrogen, oxygen or sulfur atom in the coating compound having the group, when heated with said coating compound having the group containing the nitrogen, oxygen or sulfur atom.

14. A conductive metal paste claimed in claim 13, wherein the ultrafine metal particles having a very small average particle diameter are ultrafine metal particles formed at least from one or more metal out of silver, gold, copper, platinum, palladium, rhodium, ruthenium, iridium, osmium, tungsten, nickel, tantalum, bismuth, lead, indium, tin, zinc, and titanium.

15. A conductive metal paste claimed in claim 13, wherein the average particle diameter for said ultrafine metal particles with a very small average particle diameter is chosen from a range of 2 to 10 nm.

16. A conductive metal paste claimed in claim 13, wherein the resin component acting as an organic binder contained in the organic binder resin composition is selected from thermosetting resins, thermoplastic resins or thermally decomposable resins.

17. A conductive metal paste claimed in claim 13, wherein one amine compound or more having one or more terminal amino groups is selected as said coating compound having the group containing the nitrogen, oxygen or sulfur atom.

18. A conductive metal paste claimed in claim 17, wherein the one or more amine compounds having one or more terminal amino groups include an alkylamine.

19. A conductive metal paste claimed in claim 12, wherein the reactive component having reactivity with the group containing the nitrogen, oxygen or sulfur atom in the coating compound having the group, when heated with said coating compound having the group containing the nitrogen, oxygen or sulfur atom is a cyclic acid anhydride that is derived from an aliphatic organic dibasic acid, or a derivative thereof.

20. A process for producing a conductive metal paste comprising the step of preparing a conductive metal paste in which ultrafine metal particles with a very small average particle diameter are dispersed uniformly in a organic binder resin composition, wherein:

an average particle diameter for said ultrafine metal particles with a very small average particle diameter is selected from a range of 1 to 100 nm, a dispersion obtained by dispersing the ultrafine metal particles in one or more organic solvents is used, where the surfaces of the ultrafine metal particles are in the state of being coated with one coating compound or more which has a group containing a nitrogen, oxygen or sulfur atom and capable of coordinate-bonding by a lone pairs existing in these atoms as a group capable of coordinate-bonding to a metal element contained in the ultrafine metal particle, wherein said dispersion of the ultrafine metal particles is prepared into such a composition as that said one coating compound or more having the group containing the nitrogen, oxygen or sulfur atom are contained in a total amount of 0.1 to 60 parts by weight, at need, based on 100 parts by weight of said ultrafine metal particles, and with said dispersion of the ultrafine metal particles, a resin component acting as an organic binder, a reactive component having reactivity with the group containing the nitrogen, oxygen or sulfur atom when heated with the coating compound which has the group containing the nitrogen, oxygen or sulfur atom, and an organic solvent as required, which are comprised in said composition, are mixed and stirred so as to prepare the organic binder resin composition, and thereby a paste mixture comprising said ultrafine metal particles being uniformly dispersed therein are obtained, wherein said coating compound which has the group containing the nitrogen, oxygen or sulfur as a group capable of coordinate-bonding by the lone pair is selected from amine compounds having one or more terminal amino groups, thiol compounds having one or more sulfanyl groups (—SH) or glycols having two hydroxyl groups, and one or more organic acid anhydrides or derivative(s) thereof are selected as said reactive component having reactivity with the group containing the nitrogen, oxygen or sulfur atom.

21. A process for producing a conductive metal paste claimed in claim 20, wherein an organic acid anhydride is selected as the reactive component having reactivity with the group containing the nitrogen, oxygen or sulfur atom, when heated with said coating compound which has the group containing the nitrogen, oxygen or sulfur atom.

* * * * *